US007742314B2

(12) United States Patent
Urashima et al.

(10) Patent No.: US 7,742,314 B2
(45) Date of Patent: Jun. 22, 2010

(54) WIRING BOARD AND CAPACITOR

(75) Inventors: Kazuhiro Urashima, Konan (JP); Shinji Yuri, Kasugai (JP); Manabu Sato, Nagoya (JP); Kohki Ogawa, Ichinomiya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 310 days.

(21) Appl. No.: 11/513,034

(22) Filed: Aug. 31, 2006

(65) Prior Publication Data

US 2007/0076392 A1   Apr. 5, 2007

(30) Foreign Application Priority Data

Sep. 1, 2005 (JP) ............................ P2005-254030
Apr. 14, 2006 (JP) ............................ P2006-112262
Jun. 16, 2006 (JP) ............................ P2006-168172

(51) Int. Cl.
*H05K 1/11* (2006.01)

(52) U.S. Cl. ........................ 361/793; 174/260

(58) Field of Classification Search ................ 361/793, 361/762–766, 782; 257/728; 174/260
See application file for complete search history.

(56) References Cited

U.S. PATENT DOCUMENTS

| 4,882,650 | A  | * | 11/1989 | Maher et al. ............ 361/321.4 |
| 6,721,153 | B2 | * | 4/2004  | Naito et al. ................. 361/100 |
| 6,724,638 | B1 | * | 4/2004  | Inagaki et al. ............... 361/763 |
| 6,979,890 | B2 |   | 12/2005 | Kambe et al. |
| 7,002,075 | B2 |   | 2/2006  | Kambe et al. |
| 2003/0071350 | A1 | * | 4/2003 | Takehara et al. ............ 257/728 |
| 2005/0006752 | A1 | * | 1/2005 | Ogawa ....................... 257/700 |
| 2005/0141206 | A1 | * | 6/2005 | Radhakrishnan et al. .... 361/782 |

FOREIGN PATENT DOCUMENTS

| JP | 7-86754      |   | 3/1995 |
| JP | 07086754     | * | 3/1995 |
| JP | 2002-43754 A |   | 2/2002 |
| JP | 2002-43841   |   | 2/2002 |
| JP | 2002043754   | * | 2/2002 |
| JP | 2005-39217 A |   | 2/2005 |
| JP | 2005-39243 A |   | 2/2005 |

\* cited by examiner

*Primary Examiner*—Tuan T Dinh
*Assistant Examiner*—Yuriy Semenenko
(74) *Attorney, Agent, or Firm*—Sughrue Mion, PLLC

(57) ABSTRACT

A wiring board comprising: a board core (11) having a core main surface (12) and a core reverse surface (13); a capacitor (101, 101A, 101B, 101C, 101D, 101E, 101F, 101G, 101H, 101J, 1101, 1101', 1101'', 1101''', 1101'''', 1101''''') having a capacitor main surface (102) and a capacitor reverse surface (103) and having a structure in which first inner electrode layers (141) and second inner electrode layers (142) are alternately laminated and arranged via a dielectric layer (105), the capacitor (101, 101A, 101B, 101C, 101D, 101E, 101F, 101G, 101H, 101J, 1101, 1101', 1101'', 1101''', 1101'''', 1101''''') being accommodated in the board core (11) in a state in which the core main surface (12) and the capacitor main surface (102) are oriented on a same side; and a wiring laminated portion (31) having a structure in which interlayer insulating layers (33, 35) and conductor layers (42) are alternately laminated on the core main surface (12) and the capacitor main surface (102), wherein an inductor (251, 252, 253) or a resistor (301, 302, 311, 312, 321, 322) is formed on or in the capacitor (101, 101A, 101B, 101C, 101D, 101E, 101F, 101G, 101H, 101J, 1101, 1101', 1101'', 1101''', 1101'''', 1101''''').

17 Claims, 17 Drawing Sheets

WIRING BOARD AND CAPACITOR

FIELD OF THE INVENTION

The present invention relates to a wiring board having a structure in which a capacitor mainly consisting of a ceramic and the like is embedded in a board core, a wiring laminated layer is formed by being laminated on its surface, and a semiconductor integrated circuit device is mounted thereon, as well as a capacitor used on the wiring board.

BACKGROUND OF THE INVENTION

Semiconductor integrated circuit devices (IC chips) used in such as microprocessors and chip sets of computers in recent years tend to be characterized by increasingly higher speed and higher functions, and the number of terminals tends to increase and the pitch between the terminals tends to become narrower correspondingly. Generally, a multiplicity of terminals are densely arranged in array form on the bottom surface of the IC chip, and such terminal groups are connected to terminal groups on the motherboard side in flip chip form. However, since there is a large difference in the terminal pitch between the terminal groups on the IC chip side and the terminal groups on the motherboard side, it is difficult to directly connect the IC chip onto the motherboard. For this reason, a technique is generally adopted in which a package having the IC chip mounted on a wiring board for IC chip mounting is fabricated, and the package is mounted on a motherboard.

Conventionally, there have been increasing demands for more compact-sized, multifunctional, and low-cost products with respect to packages of this type. Accordingly, as the wiring board for IC chip mounting which constitutes the package, those have hitherto been proposed in which a ceramic capacitor in the form of a chip is embedded in a core board formed of such as a polymeric material to form a core portion, and buildup layers are respectively formed on the obverse surface and the reverse surface of the core portion (e.g., refer to JP-A-2005-39243). The advantage of this configuration lies in that since the capacitor which has hitherto been surface-mounted on a package is incorporated, the degree of freedom of the surface of the core portion can be enhanced, and the wiring board for IC chip mounting can be made compact by reducing a vacant space. An additional advantage lies in that the wiring board for IC chip mounting can be made multifunctional by surface-mounting other electronic parts such as inductors and resistors in the vacant space. As a specific example of a multifunctional package, it is possible to cite, for example, one which has the function of effecting the transmission and reception of data between or among a plurality of IC chips by wireless communication. To realize the package of this type, it is necessary to configure circuits (e.g., a tuning circuit) necessary for wireless communication on the package by using a plurality of electronic parts. As a background art, JP-A-2002-43754 is also known.

SUMMARY OF THE INVENTION

However, in the case where a package structure is adopted in which inductors, resistors, and the like are surface-mounted in a vacant space, a parts mounting space for that purpose is newly required for a surface layer portion of the package. Hence, even if the multifunction can be attained, it has been difficult to attain a further compact size. In addition, in the manufacture of such package, it has not been possible to omit the process of mounting the inductors, resistors, and the like, which has been a hindrance to attaining the low cost.

The present invention has been devised in view of the above-described problems, and its object is to provide a wiring board suitable for attaining a compact size and a low cost despite the fact that the multifunction is easily attainable. Another object of the present invention is to provide a capacitor suitable for use on the above-described outstanding wiring board.

To overcome the above-described problems, in accordance with a first aspect of the invention there is provided a wiring board comprising: a board core having a core main surface and a core reverse surface; a capacitor having a capacitor main surface and a capacitor reverse surface and having a structure in which first inner electrode layers and second inner electrode layers are alternately laminated and arranged via a dielectric layer, the capacitor being accommodated in the board core in a state in which the core main surface and the capacitor main surface are oriented on a same side; a wiring laminated portion having a structure in which interlayer insulating layers and conductor layers are alternately laminated on the core main surface and the capacitor main surface, wherein an inductor or a resistor is formed on or in the capacitor.

Therefore, according to the first aspect of the wiring board, in a case where, for example, an inductor is formed on or in the capacitor itself, it is possible to configure a portion or all of a circuit of a various kind within the capacitor. In addition, in a case where, for example, a resistor is formed on or in the capacitor itself, it is possible to set different potentials within the identical capacitor. Accordingly, as compared with the conventional structure in which the inductor or the resistor is mounted on the surface layer portion of the wiring board, multifunctional and high-performance features become easily attainable. In addition, since there is no need to newly set a parts mounting space for an inductor or a resistor on the surface layer portion of the wiring board, it is possible to obtain a wiring board which is less susceptible to the restriction in realizing a further compact size, and which is suitable for making the overall size compact. Further, since the inductor mounting step or the resistor mounting step can be omitted, the wiring board becomes suitable for attaining low cost.

Here, the wiring board in the first aspect of the invention is a device for mounting a semiconductor integrated circuit device which is an object to be mounted. As an example of the "semiconductor integrated circuit device," it is possible to cite a semiconductor integrated circuit device which is used as a microprocessor or the like of a computer and which has one or a plurality of processor cores. This semiconductor integrated circuit device is, for instance, flip-chip mounted in a semiconductor integrated circuit device mounting region. It should be noted that the number of the processor cores may be two or three or more. As another example of the semiconductor integrated circuit device, it is possible to cite one which is used for application in a controller for effecting high-speed data processing. As specific examples of the function of the controller, it is possible to cite, for example, a memory controller, a multiprocessing controller, a bus controller, a video controller, and the like, and an image processing chip and a chipset correspond to them. Here, as an example of the chipset, a chipset is known which performs a central role of a motherboard, is comprised of a north bridge and a south bridge, and functions as various controllers. In addition, the "semiconductor integrated circuit device mounting region" refers to a region where a group of terminal pads are disposed on the surface of the wiring laminated portion.

The board core constituting the above-described wiring board forms a portion of the core portion in the wiring board, and is formed into the shape of a plate having, for example, the core main surface and the core reverse surface located on its opposite side. Such a board core may have an accommodating hole portion for accommodating the capacitor. This accommodating hole portion may be non-through hole which is open only at the core main surface, or a through hole which is open at both the core main surface and the core reverse surface. It should be noted that the capacitor may be embedded completely in the accommodating hole portion, or may be embedded in a state in which it projects partially.

The material for forming the board core is not particularly limited, but a preferred board core is formed of a polymeric material as a principal constituent. As specific examples of the polymeric material for forming the board core, it is possible to cite, for example, EP resin (epoxy resin), PI resin (polyimide resin), BT resin (bismaleimide-triazine resin), PPE resin (polyphenylene ether resin), and the like. In addition, it is possible to use a composite material made of these resins and glass fibers (a glass woven fabrics and a glass nonwoven fabric) or organic fibers such as polyamide fibers.

The capacitor for constituting the above-described wiring board has a capacitor main surface and a capacitor reverse surface and has a structure in which first inner electrode layers and second inner electrode layers are alternately laminated and arranged via a dielectric layer. The material for forming the dielectric layer can be selected from among a resin, a ceramic, and the like, but it is particularly preferable to use a ceramic sintered body. Namely, as a more preferable capacitor, it is possible to cite a ceramic capacitor having a capacitor main surface and a capacitor reverse surface and having a structure in which first inner electrode layers and second inner electrode layers are alternately laminated and arranged via a ceramic dielectric layer. The ceramic capacitor referred to herein includes a capacitor in which a thin film is formed on a substrate (a substrate not limited to a ceramic) by a ceramic material.

The capacitor is accommodated in the board core in a state in which the core main surface and the capacitor main surface are oriented on the same side. Namely, the capacitor is used in a state of being incorporated in the board core. It should be noted that the capacitor is disposed in a region corresponding to the semiconductor integrated circuit device mounting region in the core board. The capacitor is fixed by a filler made of a polymeric material, for example, in a state of being accommodated in the board core.

In addition, as a preferable example of the capacitor, it is possible to cite a via array type capacitor. Namely, the capacitor preferably includes: a plurality of power supplying via conductors for allowing the first inner electrode layers to conduct with each other; a plurality of grounding via conductors for allowing the second inner electrode layers to conduct with each other; power supplying electrode terminals respectively located at end portions of the plurality of power supplying via conductors; grounding electrode terminals respectively located at end portions of the plurality of grounding via conductors, wherein the plurality of power supplying via conductors and the plurality of grounding via conductors are disposed in the form of arrays. More specifically, the plurality of power supplying via conductors and the plurality of grounding via conductors, when viewed from the thickness-wise direction of the capacitor, are disposed in the form of arrays as a whole. If this configuration is provided, it becomes easily possible to attain a compact size of the overall capacitor and, hence, to attain a compact size of the overall wiring board. Moreover, a high electrostatic capacity is easily attainable despite the compact size, and power supply becomes possible on a more stable basis.

The above-described capacitor has one or a plurality of capacitor function portions. The capacitor function portion refers to a region which is formed by including the first inner electrode layers and the second inner electrode layers. At least power supply systems of the plurality of capacitor function portions should preferably be independent of each other. The number of the capacitor function portions may be two or three or more, but the capacitor function portions should preferably be present in a number identical to that of the processor cores. By adopting this configuration, all the capacitor function portions can be respectively electrically connected to all the processor cores.

It should be noted that the distance between adjacent ones of the plurality of capacitor function portions (specifically, the distance between the power supplying inner electrode layers respectively constituting the adjacent ones of the plurality of capacitor function portions) is not particularly limited. However, the aforementioned distance should preferably be of such a measure that electrostatic interference does not occur between the capacitor function portions, and specifically 50 μm or more is preferable. In particular, it is preferred that a distance more than the via pitch of the capacitor (a pitch between a grounding via and a power supplying via conductor) be secured.

In the case where the dielectric layer constituting the capacitor is a ceramic dielectric layer, for example, sintered bodies of high-temperature sintered ceramics, such as alumina, aluminum nitride, boron nitride, silicon carbide, and silicon nitride, are suitably used. In addition, sintered bodies of low-temperature sintered ceramics, such as a glass ceramic in which an inorganic ceramic filler of such as alumina is added to borosilicate glass or borosilicate lead glass, are suitably used. In this case, it is also preferable to use a sintered body of a dielectric ceramic such as barium titanate, lead titanate, and strontium titanate, depending on the application. In the case where the sintered body of a dielectric ceramic is used, a ceramic capacitor having a large electrostatic capacity becomes easily realizable.

The material for forming the first inner electrode layers and the second inner electrode layers is not particularly limited, but the use of a metal which can be sintered simultaneously with the ceramic, e.g., nickel, molybdenum, tungsten, and titanium, is suitable. It should be noted that in the case where a sintered body of a low-temperature sintered ceramic is selected, the use of copper and silver becomes further possible as the material for forming the first inner electrode layers and the second inner electrode layers.

To render the above-described capacitor multifunctional, one or two or more inductors or resistors are formed on the capacitor. Such an inductor or a resistor refers to not an inductor or a resistor which is formed separately from the capacitor, but the one which is formed integrally with the capacitor.

Such an inductor, for example, is formed on at least one of the capacitor main surface and the capacitor reverse surface of the capacitor. The inductor formed at such a position is exposed on the outer surface of the capacitor. Therefore, this arrangement is advantageous in that trimming and the like can be provided after the forming to make it possible to finely adjust the profile of the inductor, and hence the inductance can be finely adjusted. In addition, in a case where a circuit for wireless communication is configured, the circuit which includes an inductor exposed on the outer surface of the capacitor gives higher sensitivity and higher output than the circuit which includes a non-exposed inductor.

It should be noted that the inductor may be formed on only the capacitor main surface, or may be formed on only the capacitor reverse surface, or may be formed on both the capacitor main surface and the capacitor reverse surface. The advantage of the configuration in which the inductor is formed on both surfaces is as follows. Namely, in the case where the inductor is electrically independent of the capacitor function portion, according to this configuration twice as many inductors can be mounted as compared with the conventional structure in which the inductor is surface-mounted on the surface layer portion of the wiring board. Additionally, the degree of freedom of the circuit design also becomes large.

Also, the resistor, for example, is formed on at least one of the capacitor main surface and the capacitor reverse surface of the capacitor. The resistor formed at such a position is exposed on the outer surface of the capacitor, so that this arrangement is advantageous in that trimming and the like can be provided after the forming, making it possible to finely adjust the resistance value. It should be noted that the resistor may be formed on only the capacitor main surface, or may be formed on only the capacitor reverse surface, or may be formed on both the capacitor main surface and the capacitor reverse surface. The advantage of the configuration in which the resistor is formed on both surfaces is as follows. Namely, in the case where the resistor is electrically independent of the capacitor function portion, according to this configuration twice as many resistors can be mounted as compared with the conventional structure in which the resistor is surface-mounted on the surface layer portion of the wiring board. Additionally, the degree of freedom of the circuit design also becomes large.

The inductor (the obverse surface-side inductor pattern) or the resistor (obverse surface-side resistor pattern), which is formed on the capacitor main surface, can be formed by an arbitrary material exhibiting conductivity, but should preferably be formed of the same material as that of the aforementioned power supplying electrode terminal and grounding electrode terminal on the capacitor main surface, in particular. The reason is that since the inductor or the resistor can be formed concurrently in the step of forming the power supplying electrode terminal and the grounding electrode terminal, it is possible to prevent an increase in the number of manufacturing steps.

Also, the inductor (the reverse surface-side inductor pattern) or the resistor (reverse surface-side resistor pattern), which is formed on the capacitor reverse surface, can be formed of an arbitrary material exhibiting conductivity, but should preferably be formed of the same material as that of the aforementioned power supplying electrode terminal and the aforementioned grounding electrode terminal on the capacitor reverse surface, in particular. The reason is that since the inductor or the resistor can be formed concurrently in the step of forming the power supplying electrode terminal and the grounding electrode terminal, it is possible to prevent an increase in the number of manufacturing steps.

It should be noted that if the reverse surface-side inductor pattern or the reverse surface-side resistor pattern is formed not on the capacitor obverse surface but only on the capacitor reverse surface, the space on the capacitor obverse surface side can be effectively utilized for the formation of conductors for power supply. In addition, the inductor or the resistor on the wiring board is generally disposed not on the core main surface side (i.e., the semiconductor integrated circuit device mounting side) of the core board but on the core reverse surface side. Hence, there is not so much need to change the design rule as in the case in which the obverse surface-side inductor pattern or the obverse surface-side resistor pattern is adopted, so that the burden in the circuit design can be small. In the case where the above-described structure is adopted, it suffice if a through hole penetrating the core board side is provided, and the reverse surface-side inductor pattern or the reverse surface-side resistor pattern is connected thereto, to thereby establish electrical connection to the semiconductor integrated circuit device side through that through hole and the conductor layers in the wiring laminated portion.

Alternatively, the inductor may be an inner layer inductor pattern which is formed in the interior of the capacitor. The inner layer inductor pattern can be formed of an arbitrary material exhibiting conductivity, but should preferably be formed of the same material as that of the aforementioned first inner electrode layers and the aforementioned second inner electrode layers. The reason is that since the inductor can be formed concurrently in the step of forming the first inner electrode layers and the second inner electrode layers, it is possible to prevent an increase in the number of manufacturing steps. In this case, a plurality of inner layer inductor patterns may be formed on different layers in the capacitor, and may be electrically connected to each other via the inductor connecting via conductor. If such an inductor connecting via conductor is present, the plurality of inner layer inductor patterns disposed via a dielectric layer can be connected to each other, and hence can be made to function as one inductor exhibiting a high inductance. It should be noted that the inner layer inductor pattern and the reverse surface-side inductor pattern may be connected to each other via the inductor connecting via conductor, or the inner layer inductor pattern and the obverse surface-side inductor pattern may be connected to each other via the inductor connecting via conductor.

The shapes of the obverse surface-side inductor pattern, the reverse surface-side inductor pattern, the inner layer inductor pattern are not particularly limited, but loop-shaped patterns are suitable to realize a desired inductance within a limited narrow space. The line width and the inter-pattern space are not limited, but should preferably be formed to be smaller than the diameter of, for example, the power supplying via conductor or the grounding via conductor. Accordingly, for example, if the diameter of the power supplying via conductor or the grounding via conductor is 100 μm to 200 μm or thereabouts, the line width inter-pattern space of the loop-shaped pattern is preferably set to 10 μm to 100 μm or thereabouts. The reason is that, according to this setting, since the inductor of a relatively high inductance can be realized with a relatively small area, a wide space for the formation of the inductor is not required. This setting is preferable in realizing a compact size of the capacitor and, hence, in making the overall wiring board compact. The number of loops of the loop-shaped pattern can be set arbitrarily according to applications, but is generally set to one, preferably two or more.

The inductor can be disposed at an arbitrary position in the capacitor, but should preferably be disposed in a region located outside the capacitor function portion configured by including the first inner electrode layers and the second inner electrode layers. The reason is that such a position makes it possible to easily secure the space for the formation of the inductor. In addition, as compared with the case in which the inductor is disposed in a region located inside the capacitor function portion, the risk of imparting an electrical effect to the capacitor, or the risk of receiving an electrical effect from the capacitor, is small.

Alternatively, the resistor may be an inner layer resistor pattern which is formed in the interior of the capacitor. The inner layer resistor pattern can be formed of an arbitrary material exhibiting conductivity, but should preferably be formed of the same material as that of the aforementioned first inner electrode layers and the aforementioned second inner electrode layers. The reason is that since the resistor can be formed concurrently in the step of forming the first inner electrode layers and the second inner electrode layers, it is possible to prevent an increase in the number of manufacturing steps. Moreover, there is an advantage in that since the first inner electrode layers and the second inner electrode layers are thinner than the power supplying electrode terminals and the grounding electrode terminals, a compact and high-resistance resistor can be easily formed.

In addition, the resistor may be a via resistance which is formed in the interior of the capacitor. In other words, the resistor is not limited to the one extending in the planar direction of the capacitor, and may be one extending in the thicknesswise direction of the capacitor. If such a via resistance is present, the plurality of resistors disposed via a dielectric layer can be connected to each other, and can be made to function as one resistor. The via resistance is preferably formed of the same material as that of the plurality of power supplying via conductors and the plurality of grounding via conductors. The reason is that since the via resistance can be formed concurrently in the step of forming the power supplying via conductors and the grounding via conductors, it is possible to prevent an increase in the number of manufacturing steps.

The shapes of the obverse surface-side resistor pattern, the reverse surface-side resistor pattern, the inner layer resistor pattern are not particularly limited, but linear patterns are advantageous to realize a desired resistance value within a limited narrow space. Namely, the reason is that since such a shape makes it possible to make the resistance value per unit length high, the pattern can be provided with a relatively small area, and a large space is not required. Namely, the adoption of the linear pattern is preferable in realizing a compact size of the capacitor and, hence, in making the overall wiring board compact. The linear pattern may be rectilinear or curvilinear, but should preferably be meandering. The line width of the linear pattern is formed as narrowly as possible, but should preferably be formed to be smaller than the diameter of, for example, the power supplying via conductor or the grounding via conductor. Accordingly, for example, if the diameter of the power supplying via conductor or the grounding via conductor is 100 μm to 200 μm or thereabouts, the line width of the linear pattern is set to 10 μm to 100 μm or thereabouts.

The resistor can be disposed at an arbitrary position in the capacitor, but should preferably be disposed in a region located outside the capacitor function portion configured by including the first inner electrode layers and the second inner electrode layers. The reason is that such a position makes it possible to easily secure the space for the formation of the resistor. In addition, as compared with the case in which the resistor is disposed in a region located inside the capacitor function portion, the risk of imparting an electrical effect to the capacitor is small.

To render the above-described capacitor with the inductor formed thereon or therein multifunctional, a passive element or elements other than the inductor, e.g., one or two or more capacitors, may be formed on the capacitor with the inductor formed thereon or therein. Such a capacitor refers to not a capacitor which is formed separately from the capacitor with the inductor formed thereon or therein, but the one which is formed integrally with the capacitor with the inductor formed thereon or therein. Such a capacitor should preferably be disposed in a state in which it is not electrostatically affected by the first inner electrode layers and the second inner electrode layers constituting the capacitor function portion.

Also, the aforementioned capacitor may be formed on at least one of the capacitor main surface and the capacitor reverse surface. The capacitor formed at such a position is exposed on the outer surface of the capacitor, so that this arrangement is advantageous in that trimming and the like can be provided after the forming, making it possible to finely adjust the capacitance value.

Alternatively, the aforementioned capacitor may be formed in the interior of the capacitor. Such a capacitor can be formed of an arbitrary material exhibiting conductivity, but should preferably be formed of the same material as that of the aforementioned first inner electrode layers and the aforementioned second inner electrode layers. The reason is that since the inductor can be formed concurrently in the step of forming the first inner electrode layers and the second inner electrode layers, it is possible to prevent an increase in the number of manufacturing steps.

To render the above-described capacitor with the inductor formed thereon or therein multifunctional, another passive element or other passive elements, e.g., one or two or more resistors, may be formed on the capacitor with the inductor formed thereon or therein. Such a resistor refers to not a resistor which is formed separately from the capacitor with the inductor formed thereon or therein, but the one which is formed integrally with the capacitor with the inductor formed thereon or therein.

For example, the resistor is formed on at least one of the capacitor main surface and the capacitor reverse surface. Since the resistor formed at such a position is exposed on the outer surface of the capacitor, this arrangement is advantageous in that trimming and the like can be provided after the forming, making it possible to finely adjust the resistance value.

The resistor (the obverse surface-side resistor pattern), which is formed on the capacitor main surface, can be formed by an arbitrary material exhibiting conductivity, but should preferably be formed of the same material as that of the aforementioned power supplying electrode terminal and grounding electrode terminal on the capacitor main surface, in particular. The reason is that since the resistor can be formed concurrently in the step of forming the power supplying electrode terminal and the grounding electrode terminal, it is possible to prevent an increase in the number of manufacturing steps.

The resistor (the reverse surface-side resistor pattern), which is formed on the capacitor main surface, can be formed by an arbitrary material exhibiting conductivity, but should preferably be formed of the same material as that of the aforementioned power supplying electrode terminal and grounding electrode terminal on the capacitor reverse surface, in particular. The reason is that since the resistor can be formed concurrently in the step of forming the power supplying electrode terminal and the grounding electrode terminal, it is possible to prevent an increase in the number of manufacturing steps.

Alternatively, the resistor may be an inner layer resistor pattern which is formed in the interior of the capacitor. The inner layer resistor pattern can be formed of an arbitrary material exhibiting conductivity, but should preferably be formed of the same material as that of the aforementioned first inner electrode layers and the aforementioned second inner electrode layers. The reason is that since the resistor can be formed concurrently in the step of forming the first inner electrode layers and the second inner electrode layers, it is possible to prevent an increase in the number of manufacturing steps. Moreover, there is an advantage in that since the first inner electrode layers and the second inner electrode layers are thinner than the power supplying electrode terminals and the grounding electrode terminals, a compact and high-resistance resistor can be easily formed.

The resistor can be disposed at an arbitrary position in the capacitor, but should preferably be disposed in a region located outside the capacitor function portion configured by including the first inner electrode layers and the second inner electrode layers. The reason is that such a position makes it possible to easily secure the space for the formation of the resistor. In addition, as compared with the case in which the resistor is disposed in a region located inside the capacitor function portion, the risk of imparting an electrical effect to the capacitor is small.

Further, a circuit portion should preferably be configured by electrically connecting at least one of the resistor and the capacitor to the inductor. Namely, the reason is that a predetermined function can be imparted to attain the multifunction by combining the capacitor, the resistor, and the inductor. As a preferable example of the circuit portion, it is possible to cite a filter circuit configured by connecting the resistor and the inductor in series or in parallel, for example. More specifically, it is possible to cite a band pass filter which allows passage of a predetermined frequency band alone, such as a high pass filter circuit, a low pass filter circuit, and a middle pass filter circuit. As another preferable circuit portion, it is possible to cite a tuning circuit (RCL series circuit) configured by connecting the resistor, the inductor, and the capacitor in series. In the case of the capacitor having these circuit portions, it becomes possible to easily impart the function of carrying out transmission and reception of data between or among a plurality of IC chips by wireless communication, so that the high performance can be realized reliably.

In the above-described capacitor, in addition to the filter circuit and the tuning circuit, other circuit portions such as a switching circuit and an amplifier circuit may be formed. However, among the switching circuits and amplifier circuits, there are many cases where active elements such as transistors are required. Therefore, all the elements constituting such circuit portions may not be formed on the capacitor side, and some elements thereof (mainly active elements) may be formed on the wiring board side.

It should be noted that the above-described capacitor may have one or two or more signal line paths, in which case further higher performance can be attained. As a specific example of the signal line path, it is possible to cite a via conductor for a signal line path. The via conductor for a signal line path can be disposed at an arbitrary position in the capacitor, should preferably be disposed in a region located outside the capacitor function portion configured by including the first inner electrode layers and the second inner electrode layers. The reason is that such a position makes it possible to easily secure the space for the formation of the via conductor. In addition, as compared with the case in which the via conductor for a signal line path is disposed in a region located inside the capacitor function portion, the risk of receiving an electrical effect from the capacitor is small, leading to the reliable reduction of the noise. In addition, such a via conductor for a signal line path should preferably be disposed in the vicinity of various circuit portions (a filter circuit, a tuning circuit, a switching circuit, an amplifier circuit, etc.) in the capacitor to facilitate the electrical connection to each other.

To render the above-described capacitor with the resistor formed thereon or therein multifunctional, a passive element or elements other than the resistor, e.g., one or two or more capacitors, may be formed on the capacitor with the resistor formed thereon or therein. Such a capacitor refers to not a capacitor which is formed separately from the capacitor with the resistor formed thereon or therein, but the one which is formed integrally with the capacitor with the resistor formed thereon or therein. Such a capacitor should preferably be disposed in a state in which it is not electrostatically affected by the first inner electrode layers and the second inner electrode layers constituting the capacitor function portion.

Also, the aforementioned capacitor may be formed on at least one of the capacitor main surface and the capacitor reverse surface. The capacitor formed at such a position is exposed on the outer surface of the capacitor, so that this arrangement is advantageous in that trimming and the like can be provided after the forming, making it possible to finely adjust the capacitance value.

Alternatively, the aforementioned capacitor may be formed in the interior of the capacitor. Such a capacitor can be formed of an arbitrary material exhibiting conductivity, but should preferably be formed of the same material as that of the aforementioned first inner electrode layers and the aforementioned second inner electrode layers. The reason is that since the inductor can be formed concurrently in the step of forming the first inner electrode layers and the second inner electrode layers, it is possible to prevent an increase in the number of manufacturing steps.

Further, a circuit portion should preferably be configured by electrically connecting the capacitor to the resistor. Namely, the reason is that a predetermined function can be imparted to attain the multifunction by combining the capacitor and the resistor. As a preferable example of the circuit portion, it is possible to cite a filter circuit, for example. More specifically, it is possible to cite a band pass filter which allows passage of a predetermined frequency band alone, such as a high pass filter circuit, a low pass filter circuit, and a middle pass filter circuit.

The wiring laminated portion constituting the above-described wiring board has a structure in which interlayer insulating layers formed of a polymeric material as a principal constituent and conductor layers are alternately connected. It is preferred that the wiring laminated portion have a plurality of mutually electrically independent power supplying conductor portions, and that the plurality of capacitor function portions be respectively electrically connected to the plurality of processor cores via the plurality of power supplying conductor portions. It should be noted that there is a large difference in the terminal pitch between the group of terminals on the semiconductor integrated circuit device side and the group of terminals on the capacitor side, but by providing the wiring laminated portion, the processor core and the capacitor function portion can be individually and easily connected via the plurality of power supplying conductor portions. In addition, although the wiring laminated portion (first wiring laminated portion) is formed only on the core main surface and the capacitor main surface, a second wiring laminated portion may be further formed which has a structure in which interlayer insulating layers and conductor layers are alternately laminated on the core reverse surface and the capacitor reverse surface. If such a construction is provided, the electrical circuit can be formed not only on the first wiring laminated portion but on the second wiring laminated portion, so that a further multifunction of the wiring board can be attained.

As for the wiring laminated portion (first wiring laminated portion) formed on the core main surface and the capacitor main surface, a semiconductor integrated circuit device mounting region capable of mounting a semiconductor integrated circuit device having one or a plurality of processor cores may be set on its surface. A semiconductor integrated circuit device can be mounted on such a semiconductor integrated circuit device mounting region. It should be noted that the area of the semiconductor integrated circuit device mounting region is set to be equal to or smaller than the area of the capacitor main surface of the capacitor. The semiconductor integrated circuit device mounting region, as viewed in the thicknesswise direction of the capacitor, is preferably located within the capacitor main surface of the capacitor. If such a configuration is adopted, since the semiconductor integrated circuit device mounting region is located within the region immediately above the capacitor, the semiconductor integrated circuit device mounted on the semiconductor integrated circuit device mounting region is supported by the capacitor. In this case, it is preferable to use a ceramic capacitor which has high rigidity and a small coefficient of thermal expansion. Accordingly, in the above-described semiconductor integrated circuit device mounting region, the wiring laminated region is difficult to be deformed, so that the semiconductor integrated circuit device which is mounted on the semiconductor integrated circuit device mounting region can be supported more stably. It should be noted that the area of the semiconductor integrated circuit device mounting region may be set to be greater than the area of the capacitor main surface of the capacitor. However, to support the semiconductor integrated circuit device stably, the area of the capacitor main surface should preferably be set to be 50% or more of the semiconductor integrated circuit device mounting region.

In addition, according to a second aspect of the invention for solving the problems of the invention, there is provided a capacitor having a capacitor main surface and a capacitor reverse surface and having a structure in which first inner electrode layers and second inner electrode layers are alternately laminated and arranged via a dielectric layer, wherein an inductor or a resistor is formed on or in the capacitor.

In case where, for example, an inductor is formed on or in the capacitor itself, it is possible to configure a portion or all of a circuit of a various kind within the capacitor. Accordingly, as compared with the conventional structure in which the inductor is mounted on the surface layer portion of the wiring board, multifunctional and high-performance features become easily attainable. In addition, since there is no need to newly set a parts mounting space for an inductor on the surface layer portion of the wiring board, it is possible to obtain a wiring board which is less susceptible to the restriction in realizing a further compact size, and which is suitable for making the overall size compact. Further, since the inductor mounting step can be omitted, the wiring board becomes suitable for attaining low cost.

The aforementioned capacitor with the inductor formed thereon or therein should preferably comprise: a plurality of power supplying via conductors for allowing the first inner electrode layers to conduct with each other; a plurality of grounding via conductors for allowing the second inner electrode layers to conduct with each other; power supplying electrode terminals respectively located at end portions of the plurality of power supplying via conductors; and grounding electrode terminals respectively located at end portions of the plurality of grounding via conductors, wherein the plurality of power supplying via conductors and the plurality of grounding via conductors are disposed in the form of arrays.

The inductor is preferably formed on at least one of the capacitor main surface and the capacitor reverse surface. The inductor on the capacitor main surface should preferably be an obverse surface-side inductor pattern formed of the same material as that of the power supplying electrode terminals and the grounding electrode terminals. The inductor on the capacitor reverse surface should preferably be a reverse surface-side inductor pattern formed of the same material as that of the power supplying electrode terminals and the grounding electrode terminals. The inductor in the interior of the capacitor should preferably an inner layer inductor formed of the same material as that of the first inner electrode layers and the second inner electrode layers. A plurality of inner layer inductor patterns formed on different layers may be electrically connected to each other via the inductor connecting via conductor. The obverse surface-side inductor pattern or the inner layer inductor pattern should preferably be a loop-shaped pattern. In addition, from the viewpoint of the ease of securing the space for forming an inductor, the inductor should preferably be disposed in a region located outside the capacitor function portion configured by including the first inner electrode layers and the second inner electrode layers.

In addition, at least one of the resistor and the capacitor may be formed, and a circuit portion may be configured by the at least one of the resistor and the capacitor and the aforementioned inductor. The circuit portion in this case may be a tuning circuit formed by connecting the resistor, the inductor, and the capacitor, or may be a filter circuit formed by connecting the resistor and the aforementioned inductor.

In case where a resistor is formed on or in the capacitor in accordance with the second aspect, it is possible to set, for example, different potentials within the identical capacitor. Accordingly, as compared with the conventional structure in which the resistor is mounted on the surface layer portion of the wiring board, multifunctional and high-performance features become easily attainable. In addition, since there is no need to newly set a parts mounting space for a resistor on the surface layer portion of the wiring board, it is possible to obtain a wiring board which is less susceptible to the restriction in realizing a further compact size, and which is suitable for making the overall size compact. Further, since the resistor mounting step can be omitted, the wiring board becomes suitable for attaining low cost.

The aforementioned capacitor with the resistor formed thereon or therein should preferably comprise: a plurality of power supplying via conductors for allowing the first inner electrode layers to conduct with each other; a plurality of grounding via conductors for allowing the second inner electrode layers to conduct with each other; power supplying electrode terminals respectively located at end portions of the plurality of power supplying via conductors; and grounding electrode terminals respectively located at end portions of the plurality of grounding via conductors, wherein the plurality of power supplying via conductors and the plurality of grounding via conductors are disposed in the form of arrays.

The resistor is preferably formed on at least one of the capacitor main surface and the capacitor reverse surface. The resistor on the capacitor main surface should preferably be an obverse surface-side inductor pattern formed of the same material as that of the power supplying electrode terminals and the grounding electrode terminals. The resistor on the capacitor reverse surface should preferably be a reverse surface-side inductor pattern formed of the same material as that of the power supplying electrode terminals and the grounding electrode terminals. The resistor in the interior of the capacitor should preferably an inner layer resistor formed of the same material as that of the first inner electrode layers and the second inner electrode layers. The resistor is preferably a via resistance formed in the interior of the capacitor from the same material as that of the plurality of power supplying via conductors and the plurality of grounding via conductors.

From the viewpoint of making the area of the pattern small, the obverse surface-side resistor pattern, the reverse surface-side resistor pattern, or the inner layer resistor pattern should preferably be a linear pattern, particularly a meandering linear pattern is preferable. In addition, from the viewpoint of the ease of securing the space for forming a resistor, the resistor should preferably be disposed in a region located outside the capacitor function portion configured by including the first inner electrode layers and the second inner electrode layers.

A capacitor for electrically connecting to the resistor may be formed on the capacitor. In addition, a circuit portion such as a filter circuit may be configured by this capacitor and the resistor. Further, an inductor such as a coil, other than the capacitor and the resistor, may also be formed. It should be noted that a circuit portion such as an oscillator circuit may also be configured by interconnecting the capacitor, an element other than the resistor, and the inductor.

Figure 1:
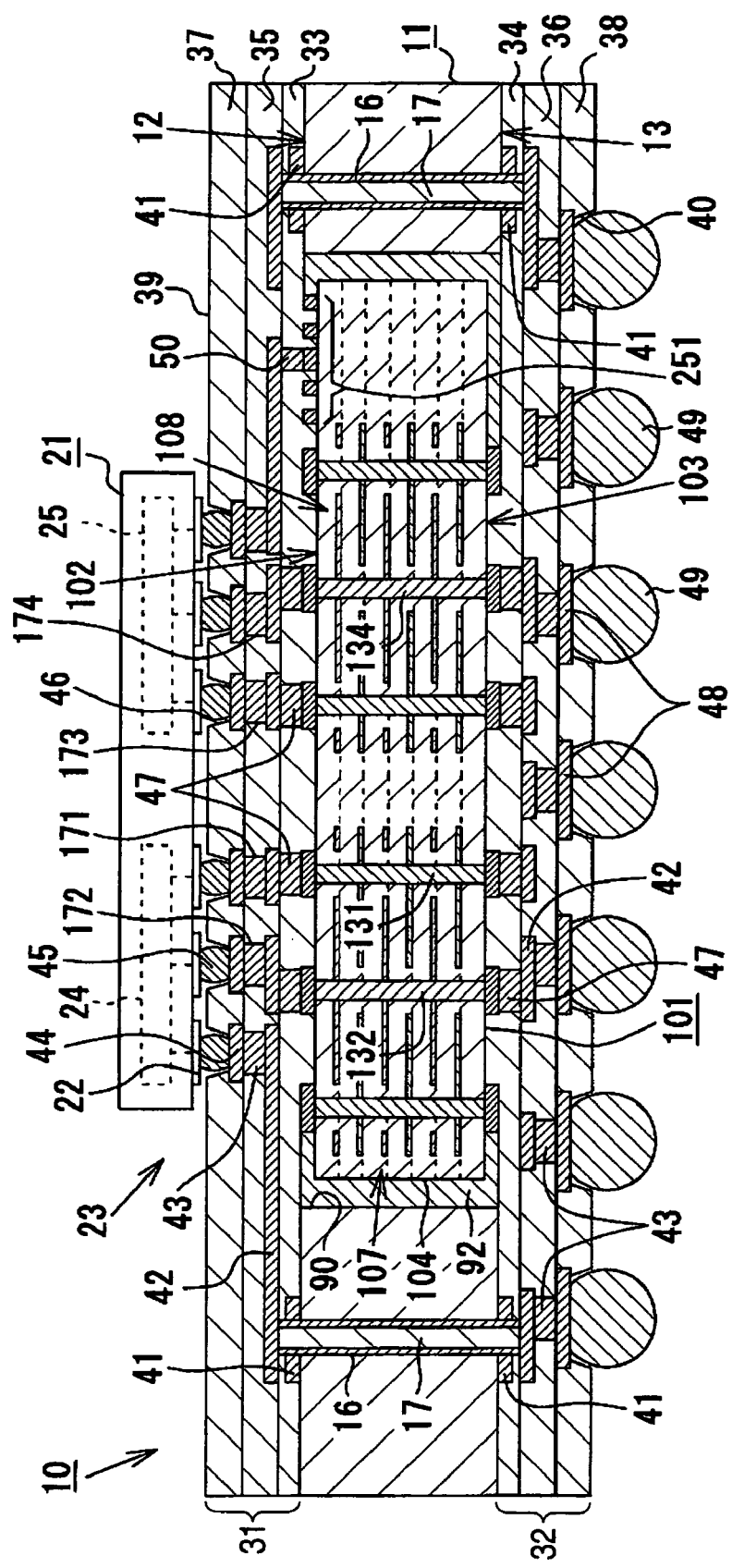
FIG. 1 is a schematic cross-sectional view illustrating a wiring board in accordance with a first embodiment of the invention.

DESCRIPTION OF REFERENCE NUMERALS AND SIGNS 10, 110: wiring board
11: board core
12: upper surface serving as a core main surface
13: lower surface serving as a core reverse surface
21: IC chip serving as a semiconductor integrated circuit device
23: IC chip mounting region serving as a semiconductor integrated circuit device mounting region
31: first buildup layer serving as a (first) wiring laminated portion
32: second buildup layer serving as a (second) wiring laminated portion
33, 34, 35, 36: resin insulating layers serving as interlayer insulating layers
42: conductor layers
101, 101A, 101B, 101C, 101D, 101E, 101F, 101G, 101H, 101J, 1101, 1101', 1101'', 1101''', 1101'''', 1101''''': ceramic capacitors serving as capacitors
102: upper surface serving as a capacitor main surface
103: lower surface serving as a capacitor reverse surface
105: ceramic dielectric layer serving as a dielectric layer
107, 108: capacitor function portions
141: first inner electrode layer
142: second inner electrode layer
171: first power supplying conductor portion serving as a power supplying conductor portion
173: second power supplying conductor portion serving as a power supplying conductor portion
251: obverse surface-side inductor pattern serving as an inductor
252: reverse surface-side inductor pattern serving as an inductor
253: inner layer inductor pattern serving as an inductor
254: inductor connecting via conductor
261: obverse surface-side resistor pattern serving as a resistor
262: inner layer resistor pattern serving as a resistor
263: reverse surface-side resistor pattern serving as a resistor
271: capacitor
300, 300A, 300B, 310: circuit portions
24, 25: processor cores
51, 52: IC chip mounting regions serving as semiconductor integrated circuit device mounting regions
161: sintered resistor pattern serving as a resistor
301, 302: obverse surface-side resistor patterns serving as resistors
311, 312: reverse surface-side resistor patterns serving as resistors
321, 322: inner layer resistor patterns serving as resistors
323: via resistance serving as a resistor
400: capacitor
405: circuit portion

DETAILED DESCRIPTION OF THE INVENTION

First Embodiment

Referring now to the drawings, a detailed description will be given of a first embodiment of the wiring board in accordance with the invention.

Figure 23:
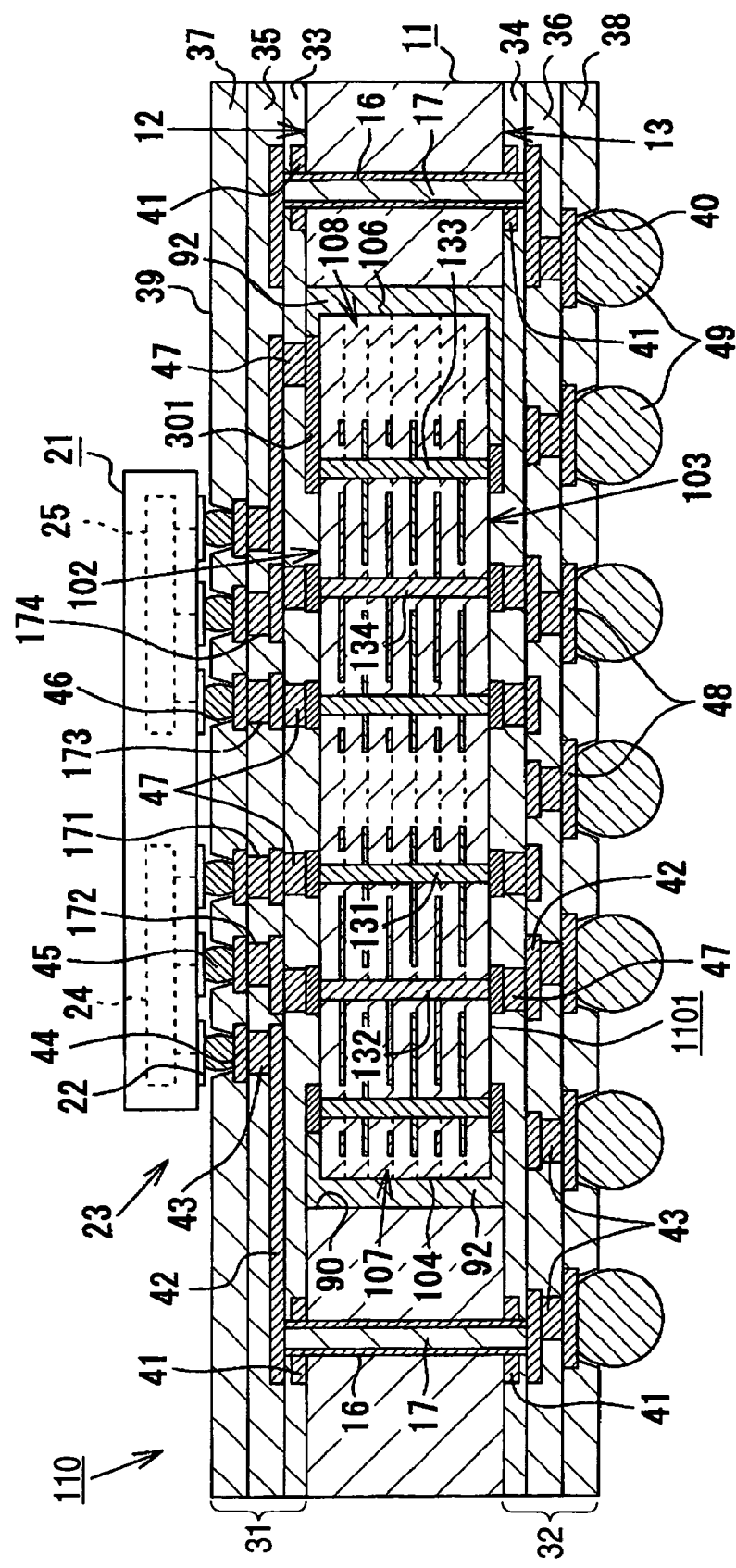
FIG. 23 is a schematic cross-sectional view illustrating the wiring board in accordance with the first embodiment of the invention.

As shown in FIGS. 1 and 23, a wiring board 10 or 110 in accordance with this embodiment is comprised of a substantially rectangular plate-shaped board core 11 which is a wiring board for mounting on an IC chip and is formed of glass epoxy; a first buildup layer 31 (wiring laminated portion) formed on an upper surface 12 (core main surface) of the board core 11; and a second buildup layer 32 formed on a lower surface 13 (core reverse surface) of the board core 11. Through hole conductors 16 are formed at a plurality of portions in the board core 11. These through hole conductors 16 connect and conduct the upper surface 12 side and the lower surface 13 side of the board core 11. It should be noted that the interior of each through hole conductor 16 is filled with a closure body 17 such as an epoxy resin. Further, conductor layers 41 formed of copper are respectively pattern-formed on the upper surface 12 and the lower surface 13 of the board core 11, and each conductor layer 41 is electrically connected to the through hole conductor 16.

The first buildup layer 31 formed on the upper surface 12 of the board core 11 has a structure in which two resin insulating layers 33 and 35 (so-called interlayer insulating layers) formed of an epoxy resin, as well as a conductor layer 42 formed of copper, are alternately laminated. In this embodiment, the coefficient of thermal expansion of the first buildup layer 31 is 30 to 40 ppm/° C. or thereabouts, specifically 35 ppm/° C. or thereabouts. It should be noted that the coefficient of thermal expansion of the first buildup layer 31 refers to an average value of measured values between 30° C. and the glass transition temperature (Tg). In addition, a portion of the conductor layer 42 disposed on the obverse surface of the first resin insulating layer 33 is electrically connected to an upper end of the through hole conductor 16. Terminal pads 44 are formed at a plurality of portions on the obverse surface of the second resin insulating layer 35 in the form of an array. Further, the obverse surface of the resin insulating layer 35 is practically entirely covered with a solder resist 37. Opening portions 46 for exposing the terminal pads 44 are formed at predetermined portions of the solder resist 37. A plurality of solder bumps 45 are respectively disposed on the surfaces of the terminal pads 44. Each solder bump 45 is electrically connected to a surface connection terminal 22 of an IC chip 21 (semiconductor integrated circuit device). The IC chip 21 is formed in the shape of a rectangular flat plate, and has two processor cores 24 and 25. The IC chip 21 in accordance with this embodiment is formed of silicon having a coefficient of thermal expansion of 3.5 ppm/° C. or thereabouts. It should be noted that the terminal pads 44 and the solder bumps 45 are located within the region immediately above a ceramic capacitor 101 or 1101 in the first buildup layer 31, and this region constitutes an IC chip mounting region 23 (semiconductor integrated circuit mounting region). The IC chip mounting region 23 is set on an obverse surface 39 of the first buildup layer 31. In addition, via conductors 43 and 47 are respectively provided in the resin insulating layers 33 and 35. Most of these via conductors 43 and 47 are disposed coaxially, and the conductor layers 41 and 42 and the terminal pads 44 are electrically connected to each other via them.

As shown in FIGS. 1 and 23, the second buildup layer 32 formed on the lower surface 13 of the board core 11 has a structure substantially identical to that of the above-described first buildup layer 31. Namely, the second buildup layer 32 has a structure in which two resin insulating layers 34 and 36 (so-called interlayer insulating layers), which has a coefficient of thermal expansion of 30 to 40 ppm/° C. or thereabouts and is formed of an epoxy resin, and the conductor layer 42 are alternately laminated. A portion of the conductor layer 42 disposed on the lower surface of the first resin insulating layer 34 is electrically connected to a lower end of the through hole conductor 16. BGA pads 48, which are electrically connected to the conductor layers 42 via the via conductors 43, are formed at a plurality of portions on the lower surface of the second resin insulating layer 36 in the form of an array. Further, the lower surface of the resin insulating layer 36 is practically entirely covered with a solder resist 38. Opening portions 40 for exposing the BGA pads 48 are formed at predetermined portions of the solder resist 38. A plurality of solder bumps 49 for establishing electrical connection to an unillustrated motherboard are respectively disposed on the surfaces of the BGA pads 48. The wiring board 10 or 110 shown in FIG. 1 or 23 is mounted on an unillustrated motherboard by means of the solder bumps 49.

As for the board core 11, its coefficient of thermal expansion in a planar direction (W-Y direction) is 10 to 15 ppm/° C. or thereabouts. It should be noted that the coefficient of thermal expansion of the board core 11 refers to an average value of measured values between 0° C. and the glass transition temperature (Tg). The board core 11 has a rectangular accommodating hole portion 90, as viewed in a plan view, which is open in the central portion of the upper surface 12 and in the central portion of the lower surface 13. Namely, the accommodating hole portion 90 is a through hole portion. The ceramic capacitor 101 or 1101 shown in such as FIGS. 2 to 5 and FIGS. 24 and 27 is accommodated in the accommodating hole portion 90 in an embedded state. It should be noted that the ceramic capacitor 101 or 1101 is accommodated with its upper surface 102 (capacitor main surface) facing the same side as the upper surface 12 of the board core 11. The ceramic capacitor 101 or 1101 in accordance with this embodiment has the shape of a rectangular flat plate which is 6.0 mm long, 12.0 mm wide, and 0.8 mm thick. It should be noted that the thickness of the ceramic capacitor 101 or 1101 is preferably not less than 0.2 mm and not more than 1.0 mm. If the thickness of the ceramic capacitor 101 or 1101 is less than 0.2 mm, the stress at the time of bonding the IC chip 21 onto the IC chip mounting region 23 cannot by reduced by the ceramic capacitor 101 or 1101, so that the wiring board 10 or 110 becomes insufficient as a support. On the other hand, if the thickness of the ceramic capacitor 101 or 1101 is greater than 1.0 mm, the wiring board 10 or 110 becomes large in thickness. More preferably, the thickness of the thickness of the ceramic capacitor 101 or 1101 is not less than 0.4 mm and not more than 0.8 mm. The ceramic capacitor 101 or 1101 is disposed in a region immediately below the IC chip mounting region 23 in the board core 11. It should be noted that the area of the IC chip mounting region 23 (an area of the region where the terminal pads 44 are formed in the first buildup layer 31) is set to be smaller than the area of the upper surface 102 of the ceramic capacitor 101 or 1101. The IC chip mounting region 23, as viewed in the thicknesswise direction of the ceramic capacitor 101 or 1101, is located within the upper surface 102 of the ceramic capacitor 101 or 1101.

As shown in FIGS. 1 and 23, a gap between the inner surface of the accommodating hole portion 90 and a side surface of the ceramic capacitor 101 or 1101 is filled with a filler 92 formed of a polymeric material (thermosetting resin such as epoxy in this embodiment). This filler 92 has the functions of fixing the ceramic capacitor 101 or 1101 to the board core 11 and of allowing the deformation in the planar direction and the thicknesswise direction of the ceramic capacitor 101 or 1101 and the board core 11 to be absorbed by their own resilient deformation. It should be noted that the ceramic capacitor 101 or 1101 has a substantially square shape in a plan view, and each of its four corners is rounded with a radius of 0.60 mm or more (or chamfered with a taper C of 0.60 or more). As a result, when the filler 92 is deformed in consequence of a temperature change, it is possible to alleviate the concentration of stress at the corner portions of the ceramic capacitor 101 or 1101, so that it is possible to prevent the occurrence of cracks in the filler 92.

As shown in FIGS. 1 to 5 and FIGS. 23 to 27, the ceramic capacitor 101 or 1101 in accordance with this embodiment is a so-called via array type ceramic capacitor. The coefficient of thermal expansion of a ceramic sintered body 104 constituting the ceramic capacitor 101 or 1101 is preferably an intermediate value between the coefficient of thermal expansion of the IC chip 21 and the coefficient of thermal expansion of the buildup layers 31 and 32, more preferably a value close to the coefficient of thermal expansion of the IC chip 21. In this embodiment, the coefficient of thermal expansion of the ceramic sintered body 104 is 8 to 12 ppm/° C. or thereabouts, specifically 9.5 ppm/° C. or thereabouts. It should be noted that the coefficient of thermal expansion of the ceramic sintered body 104 refers to an average value of measured values between 30° C. and 250° C. In addition, the ceramic sintered body 104 is a plate-like piece having the upper surface 102 and a lower surface 103 (capacitor reverse surface). It should be noted that the resin insulating layer 33 constituting the first buildup layer 31 is formed on the upper surface 102 of the ceramic sintered body 104, while the resin insulating layer 34 constituting the second buildup layer 32 is formed on the lower surface 103 of the ceramic sintered body 104. The ceramic sintered body 104 has a structure in which first inner electrode layers 141 and second inner electrode layers 142 are alternately laminated and arranged via a ceramic dielectric layer 105. The ceramic dielectric layer 105 consists of a sintered body of barium titanate, i.e., a kind of a high-dielectric-constant ceramic, and functions as a dielectric (insulator) between the first inner electrode layer 141 and the second inner electrode layer 142. The first inner electrode layers 141 and the second inner electrode layers 142 are layers which are formed of nickel as a principal constituent, and are arranged alternately inside the ceramic sintered body 104.

As shown in FIGS. 2 to 5 and FIGS. 24 to 27, the ceramic capacitor 101 or 1101 has two capacitor function portions 107 and 108 which are mutually electrically independent functional units. It should be noted that common ceramic dielectric layers 105 are used for both of the capacitor function portions 107 and 108. In addition, as viewed from the thicknesswise direction of the ceramic capacitor 101 or 1101, the processor core 24 of the IC chip 21 is located within the upper surface of the capacitor function portion 107, while the processor core 25 of the IC chip 21 is located within the upper surface of the capacitor function portion 108.

Figure 3:
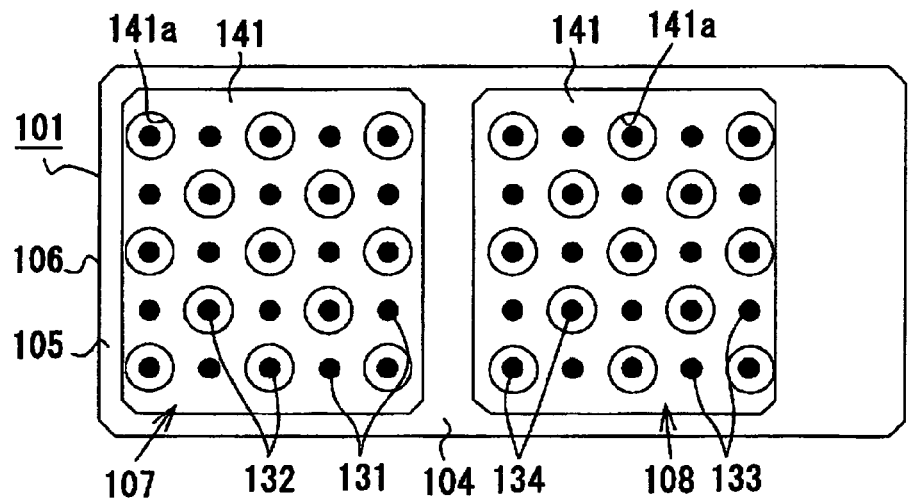
FIG. 3 is an explanatory schematic diagram for explaining the connection in an inner layer of the ceramic capacitor in accordance with the first embodiment.
Figure 4:
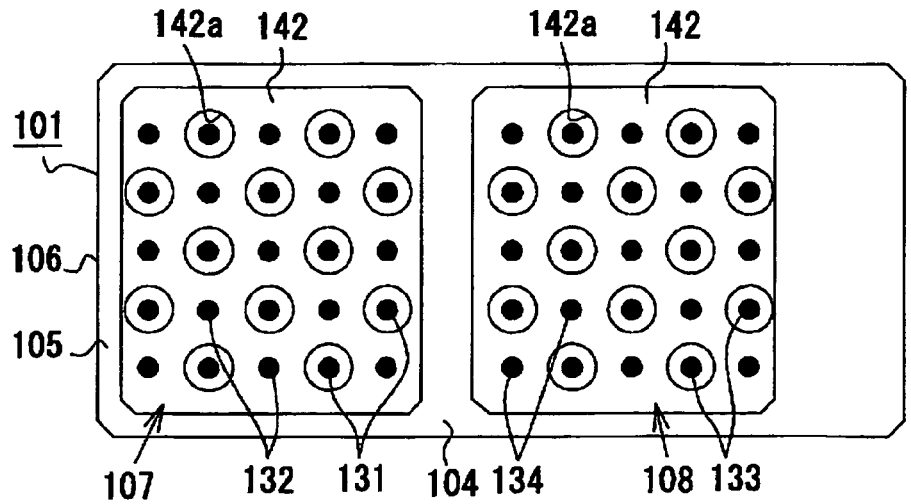
FIG. 4 is an explanatory schematic diagram for explaining the connection in the inner layer of the ceramic capacitor in accordance with the first embodiment.

A multiplicity of via holes 130 are formed in the capacitor function portion 107. These via holes 130 penetrate the capacitor function portion 107 in its thicknesswise direction, and are arranged on the entire surface of the capacitor function portion 107 in the form of an array. A plurality of via conductors 131 and 132 providing communication between the upper surface 102 and the lower surface 103 of the ceramic sintered body 104 in the capacitor function portion 107 are formed in the respective via holes 130 by using nickel as a principal constituent. Each first power supplying via conductor 131 penetrates the respective first inner electrode layer 141, and electrically connects them to each other. Each first grounding via conductor 132 penetrates the respective second inner electrode layers 142, and electrically connects them to each other. Here, as shown in FIG. 3, a clearance hole 141a is formed in the first inner electrode layer 141 in a region where the first grounding via conductor 132 penetrates, and the first inner electrode layer 141 and the first grounding via conductor 132 are electrically insulated from each other. Similarly, as shown in FIG. 4, a clearance hole 142*a* is formed in the second inner electrode layer 142 in a region where the first power supplying via conductor 131 penetrates, and the second inner electrode layer 142 and the first power supplying via conductor 131 are electrically insulated from each other.

The first power supplying via conductors 131 and the first grounding via conductors 132 are respectively formed in the form of an array as a whole. It should be noted that although the via conductors 131 and 132 are illustrated in the array of 3 rows×3 rows (or 5 rows×5 rows) for the explanation's sake, a greater number of rows are actually present.

As shown in FIGS. 2 to 5 and FIGS. 24 to 27, a plurality of first power supplying electrode terminals 111 and a plurality of first grounding electrode terminals 112 are projectingly provided on the upper surface 102 of the ceramic sintered body 104 in the capacitor function portion 107. Also, a plurality of first power supplying electrode terminals 121 and a plurality of first grounding electrode terminals 122 are projectingly provided on the lower surface 103 of the ceramic sintered body 104 in the capacitor function portion 107. The electrode terminals 111 and 112 on the upper surface 102 side are electrically connected to the aforementioned via conductors 47. Meanwhile, the electrode terminals 121 and 122 on the lower surface 103 side are electrically connected to electrodes (contacts) of an unillustrated motherboard via the via conductors 47, the conductor layers 42, the via conductors 43, the BGA pads 48, and the solder bumps 49. In addition, substantially central portions of bottom surfaces of the electrode terminals 111 and 112 are directly connected to upper surface 102-side end faces of the via conductors 131 and 132, while substantially central portions of bottom surfaces of the electrode terminals 121 and 122 are directly connected to lower surface 103-side end faces of the via conductors 131 and 132. Accordingly, the power supplying electrode terminals 111 and 121 conduct with the first power supplying via conductors 131 and the first inner electrode layers 141, while the grounding electrode terminals 112 and 122 conduct with the first grounding via conductors 132 and the second inner electrode layers 142.

Similarly, the multiplicity of via holes 130 are also formed in the capacitor function portion 108 shown in FIGS. 2 to 5 and FIGS. 24 to 27. A plurality of via conductors 133 and 134 providing communication between the upper surface 102 and the lower surface 103 of the ceramic sintered body 104 in the capacitor function portion 108 are formed in the respective via holes 130 by using nickel as a principal constituent. Each second power supplying via conductor 133 penetrates the respective first inner electrode layer 141, and electrically connects them to each other. Each second grounding via conductor 134 penetrates the respective second inner electrode layer 142, and electrically connects them to each other. The second power supplying via conductors 133 and the second grounding via conductors 134 are respectively formed in the form of an array as a whole. It should be noted that although the via conductors 133 and 134 are illustrated in the array of 3 rows×3 rows (or 5 rows×5 rows) for the explanation's sake, a greater number of rows are actually present.

A plurality of second power supplying electrode terminals 113 and a plurality of second grounding electrode terminals 114 are projectingly provided on the upper surface 102 of the ceramic sintered body 104 in the capacitor function portion 108. Also, a plurality of second power supplying electrode terminals 123 and a plurality of second grounding electrode terminals 124 are projectingly provided on the lower surface 103 of the ceramic sintered body 104 in the capacitor function portion 108. The electrode terminals 113 and 114 on the upper surface 102 side are electrically connected to the aforementioned via conductors 47. Meanwhile, the electrode terminals 123 and 124 on the lower surface 103 side are electrically connected to electrodes (contacts) of an unillustrated motherboard via the via conductors 47, the conductor layers 42, the via conductors 43, the BGA pads 48, and the solder bumps 49. In addition, substantially central portions of bottom surfaces of the electrode terminals 113 and 114 are directly connected to upper surface 102-side end faces of the via conductors 133 and 134, while substantially central portions of bottom surfaces of the electrode terminals 123 and 124 are directly connected to lower surface 103-side end faces of the via conductors 133 and 134. Accordingly, the power supplying electrode terminals 113 and 123 conduct with the second power supplying via conductors 133 and the first inner electrode layers 141, while the grounding electrode terminals 114 and 124 conduct with the second grounding via conductors 134 and the second inner electrode layers 142.

Figure 2:
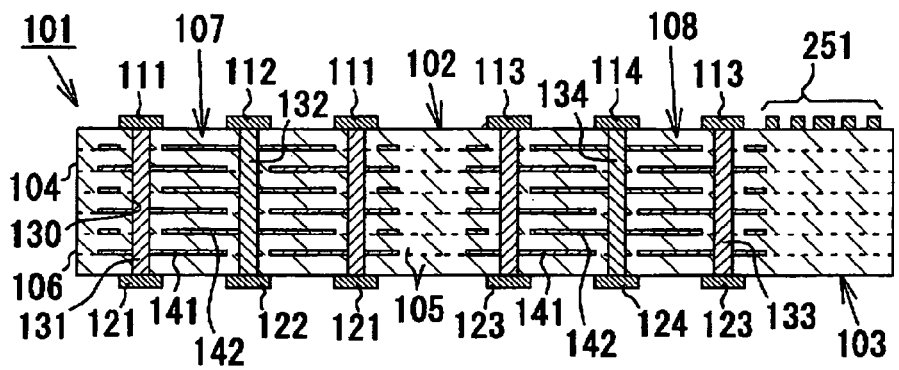
FIG. 2 is a schematic cross-sectional view of a ceramic capacitor in accordance with the first embodiment.
Figure 24:
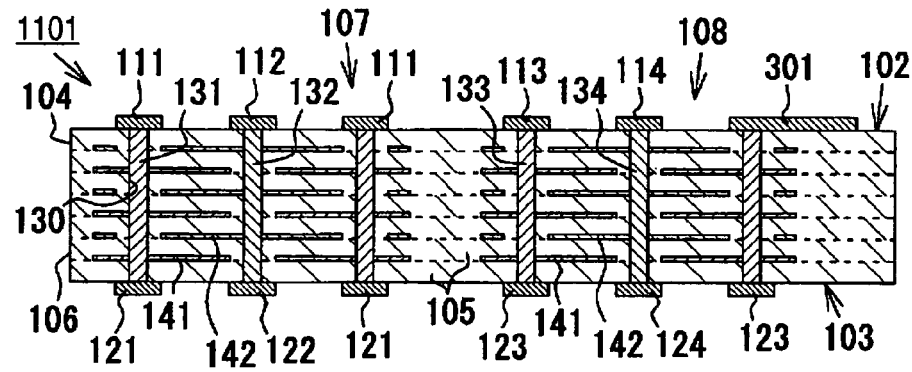
FIG. 24 is a schematic cross-sectional view of the ceramic capacitor in accordance with the first embodiment.
Figure 25:
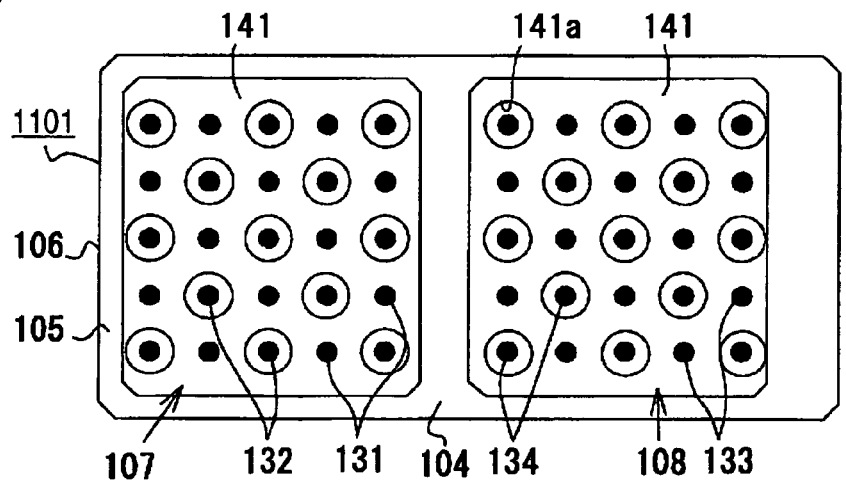
FIG. 25 is an explanatory schematic diagram for explaining the connection in the inner layer of the ceramic capacitor in accordance with the first embodiment.
Figure 26:
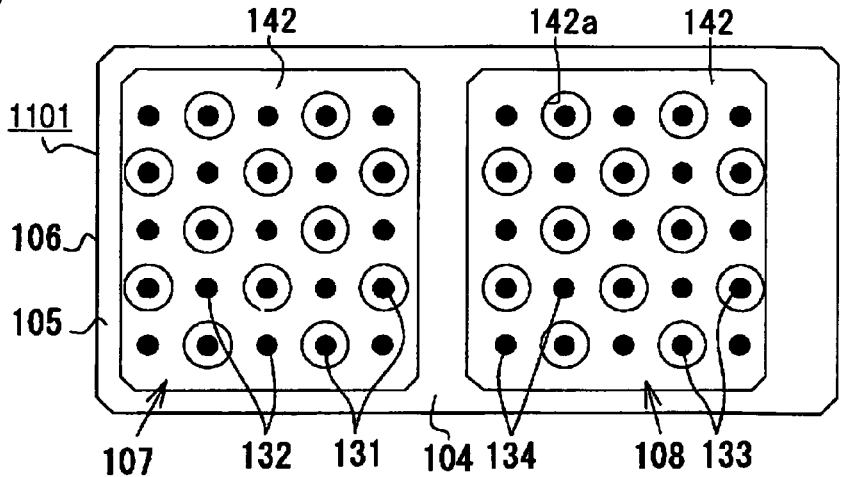
FIG. 26 is an explanatory schematic diagram for explaining the connection in the inner layer of the ceramic capacitor in accordance with the first embodiment.

As shown in FIGS. 2 and 24, the electrode terminals 111, 112, 113, and 114 are formed by using nickel as a principal constituent, and their overall surfaces are coated by an unillustrated copper plating layer. Similarly, the electrode terminals 121, 122, 123, and 124 are also formed by using nickel as a principal constituent, and their surfaces are coated by an unillustrated copper plating layer. It should be noted that in this embodiment the diameter of each of the electrode terminals 111 to 114 and 121 to 124 is set to approximately 500 μm, and a minimum length of the pitch is set to approximately 580 μm.

When electric conduction is effected from the motherboard side via the electrode terminals 121 and 122 (or electrode terminals 123 and 124) to apply a voltage across the first inner electrode layers 141 and the second inner electrode layers 142, positive charges, for example, are accumulated in the first inner electrode layers 141, while negative charges, for example, are accumulated in the second inner electrode layers 142. As a result, the ceramic capacitor 101 or 1101 functions as a capacitor. In addition, in the capacitor function portion 107, the first power supplying via conductors 131 and the first grounding via conductors 132 are respectively disposed adjacent to each other, and are set such that the directions of current flowing through the first power supplying via conductors 131 and the first grounding via conductors 132 become opposite to each other. Similarly, in the capacitor function portion 108, the second power supplying via conductors 133 and the second grounding via conductors 134 are respectively disposed-adjacent to each other, and are set such that the directions of current flowing through the second power supplying via conductors 133 and the second grounding via conductors 134 become opposite to each other. A reduction of the inductance component is thereby attained.

As shown in FIGS. 1 and 23, a portion of each of the first power supplying via conductors 131 is electrically connected to the processor core 24 of the IC chip 21 through the first power supplying electrode terminal 111, a first power supplying conductor portion 171 (power supplying conductor portion) provided in the first buildup layer 31, and the surface connection terminal 22 of the IC chip 21. A portion of each of the first grounding via conductors 132 is electrically connected to the processor core 24 through the first grounding electrode terminal 112, a first grounding conductor portion 172 provided in the first buildup layer 31, and the surface connection terminal 22. As a result, it becomes possible to supply electric power from the capacitor function portion 107 to the processor core 24. It should be noted that each of the first power supplying conductor portions 171 and the first grounding conductor portions 172 is a conductor portion constituted by the via conductor 47, the conductor layer 42, the via conductor 43 the terminal pad 44, and the solder bump 45.

Similarly, a portion of each of the second power supplying via conductors 133 is electrically connected to the processor core 25 of the IC chip 21 through the second power supplying electrode terminal 113, a second power supplying conductor portion 173 (power supplying conductor portion) provided in the first buildup layer 31, and the surface connection terminal 22 of the IC chip 21. A portion of each of the second grounding via conductors 134 is electrically connected to the processor core 25 through the second grounding electrode terminal 114, a second grounding conductor portion 174 provided in the first buildup layer 31, and the surface connection terminal 22. As a result, it becomes possible to supply electric power from the capacitor function portion 108 to the processor core 25. It should be noted that each of the second power supplying conductor portions 173 and the second grounding conductor portions 174 is a conductor portion constituted by the via conductor 47, the conductor layer 42, the via conductor 43 the terminal pad 44, and the solder bump 45. The second power supplying conductor portion 173 is electrically independent of the first power supplying conductor portion 171, and the second grounding conductor portion 174 is electrically independent of the first grounding conductor portion 172.

Accordingly, in the wiring board 10 or 110 in accordance with this embodiment, an independent power supply system is set for each of the processor cores 24 and 25. Therefore, the capacitor function portions 107 and 108 are electrically independent of each other. Hence, electrical paths within the ceramic capacitor 101 or 1101 are separated into a first electrical path connecting the capacitor function portion 107 and the processor core 24 and a second electrical path connecting the capacitor function portion 108 and the processor core 25. In addition, although the insulating portions (ceramic dielectric layers 105) of the respective capacitor function portions 107 and 108 are physically integrated with each other, the conductor portions of the capacitor function portions 107 and 108 have their respective installation regions separated from each other, and are therefore physically independent.

Figure 5:
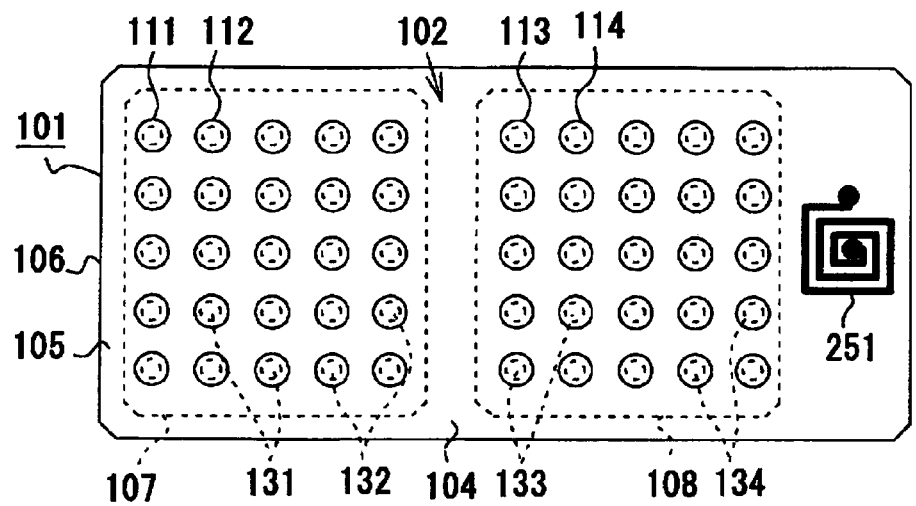
FIG. 5 is a schematic plan view for explaining the appearance of the upper surface of the ceramic capacitor in accordance with the first embodiment.

Further, as shown in such as FIGS. 1 and 5, the ceramic capacitor 101 constituting the wiring board 10 in accordance with this embodiment has an obverse surface-side inductor pattern 251 serving as an inductor. Here, the obverse surface-side inductor pattern 251 is disposed in a region located outside the capacitor function portions 107 and 108 on the upper surface 102 (capacitor main surface) of the ceramic capacitor 101. In addition, this obverse surface-side inductor pattern 251 has a loop-shaped pattern, and the number of its loops (windings) is about 3. This obverse surface-side inductor pattern 251 is set such that its line width and the inter-pattern space become smaller than the diameter (approx. 150 µm) of each of the via conductors 131 to 134 (specifically, to 50 µm to 60 µm). As shown in FIG. 1, in this embodiment, an inner end of the obverse surface-side inductor pattern 251 is electrically connected to a via conductor 50 on the wiring board 10 side, while an outer end thereof is electrically connected similarly to a different via conductor (not shown) on the wiring board 10 side.

The obverse surface-side inductor pattern 251 is formed by using nickel as a principal constituent, and its surface is coated by an unillustrated copper plating layer. In other words, the obverse surface-side inductor pattern 251 in accordance with this embodiment is formed of the same material as that of the electrode terminals 111 to 114 on the upper surface 102 (capacitor main surface).

Figure 27:
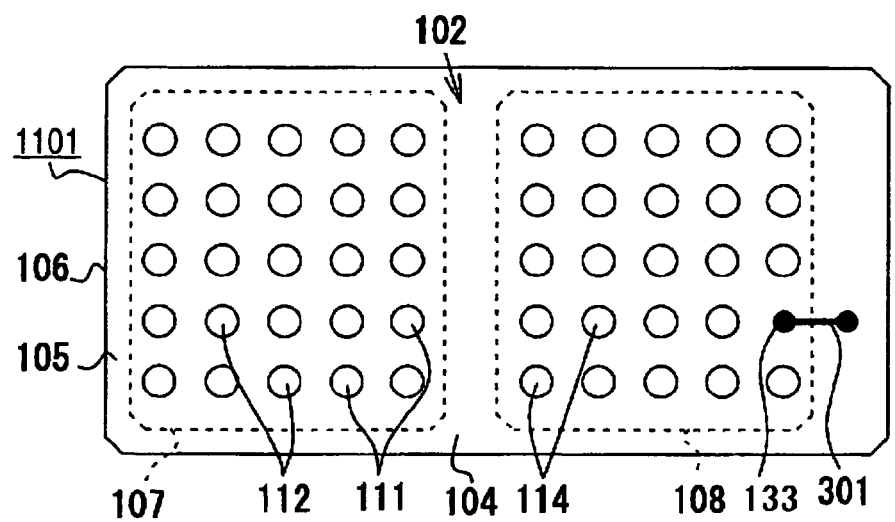
FIG. 27 is a schematic plan view for explaining the appearance of the upper surface of the ceramic capacitor in accordance with the first embodiment.

Further, as shown in such as FIGS. 23 and 27, the ceramic capacitor 1101 constituting the wiring board 110 in accordance with this embodiment has an obverse surface-side resistor pattern 301 serving as a resistor. Here, the obverse surface-side resistor pattern 301 is disposed in a region located outside the capacitor function portions 107 and 108 on the upper surface 102 (capacitor main surface) of the ceramic capacitor 1101. In addition, this obverse surface-side resistor pattern 301 has a rectilinear pattern, and its line width is set to be smaller than the diameter (approx. 150 µm) of each of the via conductors 131 to 134 (specifically, 50 µm to 60 µm). In this embodiment, one end of the obverse surface-side resistor pattern 301 is connected to an end portion of the second power supplying via conductor 133, but one end of the obverse surface-side resistor pattern 301 may be connected to another one of the via conductors 131, 132, and 134 depending on an application, or may not be connected to any of these via conductors 131 to 134. The obverse surface-side resistor pattern 301 is formed by using nickel as a principal constituent, and its surface is coated by an unillustrated copper plating layer. In other words, the obverse surface-side resistor pattern 301 in accordance with this embodiment is formed of the same material as that of the electrode terminals 111 to 114 on the upper surface 102 (capacitor main surface).

Figure 28:
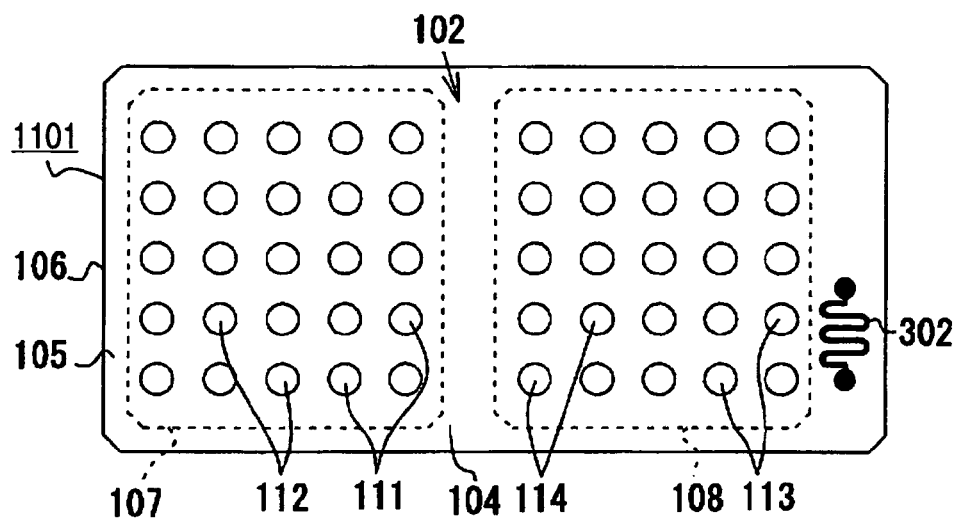
FIG. 28 is a schematic plan view for explaining the appearance of the upper surface of the ceramic capacitor in accordance with the first embodiment.
Figure 29:
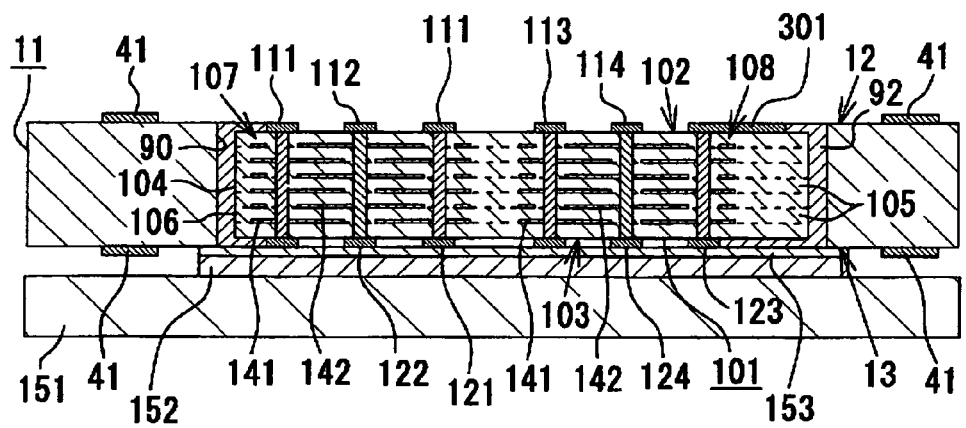
FIG. 29 is a diagram explaining the method of manufacturing the wiring board in accordance with the first embodiment.

It should be noted that an obverse surface-side resistor pattern 302, i.e., a resistor, may be formed by a curved linear pattern, as shown in a modification shown in FIG. 28.

Next, a description will be given of the method of manufacturing the wiring board 10 or 110 in accordance with this embodiment.

In a preparing step, the board core 11 and the ceramic capacitor 101 or 1101 are respectively fabricated by conventionally known techniques, and are prepared in advance.

Figure 6:
FIG. 6 is a diagram explaining a method of manufacturing the wiring board in accordance with the first embodiment.

The board core 11 is fabricated as follows. First, a copper clad laminate is prepared which is clad with copper foil on both sides of a base material which is 400 mm long, 400 mm wide, and 0.8 mm thick. It should be noted that the thickness of the base material is preferably not less than 0.2 mm and not more than 1.0 mm. Next, drilling is performed on the copper clad laminate by using a router, whereby a through hole serving as the accommodating hole portion 90 is formed in advance at a predetermined position (see FIG. 6). It should be noted that the through hole serving as the accommodating hole portion 90 is a hole which is substantially rectangular in cross section, with a longitudinal length of 14.0 mm and a transverse length of 30.0 mm, and whose four corners are rounded with a radius of 0.1 to 0.2 mm or thereabouts. Further, the copper foil on both surfaces of the copper clad laminate is subjected to etching so as to pattern the conductor layers 41 by the subtracting method, for example. Specifically, after electroless copper plating, electrolytic copper plating is performed by using this electroless copper plating layer as a common electrode. This electrolytic copper plating layer is further laminated with a dry film, and as exposure and development are carried out with respect to the dry film, the dry film is formed into a predetermined pattern. In this state, an unnecessary electrolytic copper plating layer, electroless copper layer, and copper foil are removed by etching. Subsequently, the board core 11 is obtained by exfoliating the dry film.

In addition, the ceramic capacitor 101, 1101 is fabricated as follows. Namely, ceramic green sheets are formed, and nickel paste for inner electrode layers is screen-printed on these green sheets and is allowed to dry. In consequence, first inner electrode portions and second inner electrode portions, which respectively serve as the first inner electrode layers 141 and the second inner electrode layers 142 later, are formed. Next, the green sheets each having the first inner electrode portions formed thereon and the green sheets each having the second inner electrode portions formed thereon are alternately laminated, and as a pressing force is imparted thereto in the laminated direction of the sheets, thereby integrating the green sheets and forming a green sheet laminate.

Furthermore, the via holes 130 are penetratingly formed in the green sheet laminate by using a laser processing machine, and nickel paste for via conductors is filled into the respective via holes 130 by using an unillustrated paste press-fitting and filling device. Next, paste for forming electrode terminals is printed on the upper surface of the green sheet laminate, so as to form the first power supplying electrode terminals 111, the first grounding electrode terminals 112, the second power supplying electrode terminals 113, and the second grounding electrode terminals 114 on the upper surface side of the green sheet laminate in such a manner as to cover the upper end faces of the respective conductors. Also, the paste is printed on the lower surface of the green sheet laminate, so as to form the first power supplying electrode terminals 121, the first grounding electrode terminals 122, the second power supplying electrode terminals 123, and the second grounding electrode terminals 12 on the lower surface side of the green sheet laminate in such a manner as to cover the lower end faces of the respective conductors. Further, in this step, the loop-shaped obverse surface-side inductor pattern 251 is also formed by printing the aforementioned paste for forming electrode terminals at a predetermined position. Further, in this step, the linear obverse surface-side resistor pattern 301 is also formed by printing the aforementioned paste for forming electrode terminals at a predetermined position. Subsequently, the green sheet laminate is allowed to dry, and the surface terminal portions are solidified to some extent. Next, the green sheet laminate is degreased, and firing is performed at a predetermined temperature for a predetermined period of time. As a result, barium titanate and nickel in the paste are simultaneously sintered, thereby obtaining the ceramic sintered body 104.

It should be noted that the formation of the obverse surface-side inductor pattern 251 may be effected by a technique other than the technique of printing the paste for forming electrode terminals, and may be effected by the printing of paste for forming an inductor pattern prepared separately. Still alternatively, the obverse surface-side inductor pattern 251 may be formed by performing plating, sputtering, paste printing, or the like after the sintering of the green sheet laminate.

Next, electroless copper plating (thickness: 10 μm or thereabouts) is carried out with respect to the respective electrode terminals 111 to 114 and 121 to 124 and the obverse surface-side inductor pattern 251 of the ceramic sintered body 104 thus obtained. In consequence, the copper plating layer is formed on the respective electrode terminals 111 to 114 and 121 to 124, thereby completing the ceramic capacitor 101 or 1101. In this case, electrolytic copper plating may be performed instead of electroless copper plating.

It should be noted that trimming of the obverse surface-side inductor pattern 251 may be carried out, as required, to finely adjust the inductance. As its specific technique, it is possible to cite a technique whereby the obverse surface-side inductor pattern 251 is removed by small degrees by laser processing to change the inductance.

Figure 7:
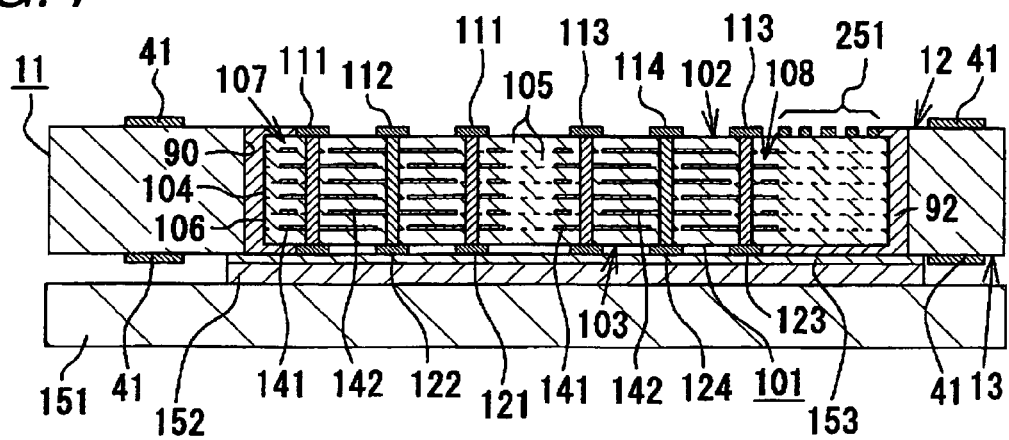
FIG. 7 is a diagram explaining a method of manufacturing the wiring board in accordance with the first embodiment.

In the subsequent fixing step, the ceramic capacitor 101 or 1101 is accommodated in the accommodating hole portion 90 by using a mounting device (made by Yamaha Motor Co., Ltd.) (see FIG. 7). At this time, the lower surface 13-side opening of the accommodating hole portion 90 is sealed by an exfoliable adhesive tape 152. This adhesive tape 152 is supported by a supporting table 151. The ceramic capacitor 101 or 1101 is adhered and temporarily fixed to an adhesive surface 153 of such an adhesive tape 152.

Figure 8:
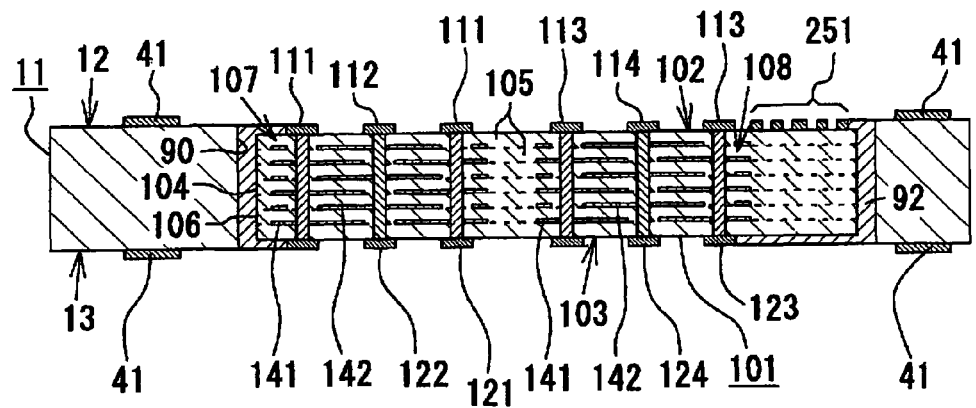
FIG. 8 is a diagram explaining a method of manufacturing the wiring board in accordance with the first embodiment.
Figure 30:
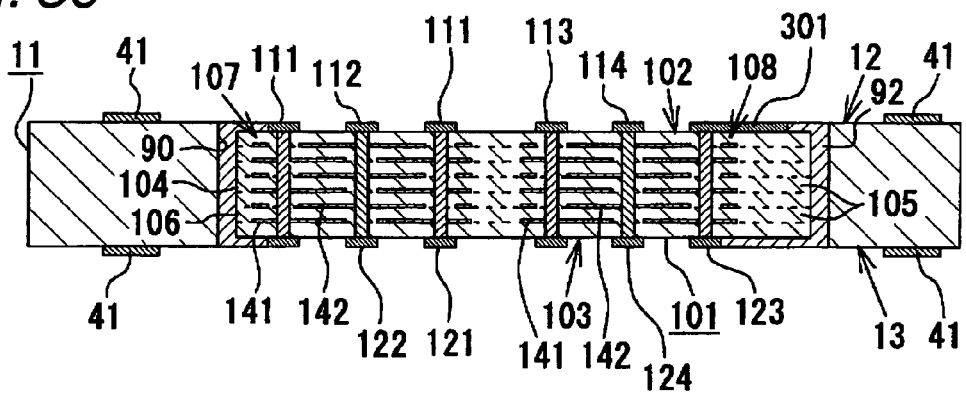
FIG. 30 is a diagram explaining the method of manufacturing the wiring board in accordance with the first embodiment.

In this state, the filler 92 made of a thermosetting resin (an underfiller made by NAMIX Co., Ltd.) is filled into gaps between the inner surfaces of the accommodating hole portion 90 and the side surfaces 106 of the ceramic capacitor 101 by using a dispenser (made by Asymtek Corporation). Subsequently, if heat treatment is carried out, the filler 92 is cured, so that the ceramic capacitor 101 is fixed in the accommodating hole portion 90. Then, at this point of time, the adhesive tape 152 is peeled off (see FIG. 8, FIG. 30).

Subsequently, the buildup layer forming step is carried out. In the buildup layer forming step, the first buildup layer 31 is formed on the upper surface 12 and the upper surface 102 in accordance with a conventionally known technique, and the second buildup layer 32 is formed on the lower surface 13 and the lower surface 103. Specifically, a photosensitive epoxy resin is coated on the upper surface 12 and the upper surface 102, while the photosensitive epoxy resin is coated on the lower surface 13 and the lower surface 103, and exposure and development are carried out, thereby forming the first resin insulating layers 33 and 34 having blind holes at the positions where the via conductors 47 are to be formed. Further, through holes penetrating the board core 11 and the resin insulating layers 33 nod 34 are formed in advance at predetermined positions by carrying out laser drilling by using a YAG laser or a carbon dioxide laser. Then, after forming the through hole conductors 16 by carrying out electroless copper plating and electrolytic copper plating in accordance with a conventionally known technique, the closure body 17 is formed by being filled in the interior of each through hole conductor 16. Then, electrolytic copper plating is carried out in accordance with a conventionally known technique (e.g., the semi-additive process) to form the via conductor 47 in each of the blind holes and form the second conductor layer 42 on the first resin insulating layers 33 and 34.

Next, the photosensitive epoxy resin is coated on the first resin insulating layers 33 and 34, and exposure and development are carried out, thereby forming the second resin insulating layers 35 and 36 having the blind holes at the positions where the via conductors 43 are to be formed. Then, electrolytic copper plating is carried out in accordance with a conventionally known technique, whereby the via conductor 43 is formed in the interior of each blind hole, the terminal pads 44 are formed on the second resin insulating layer 35, and the BGA pads 48 are formed on the second resin insulating layer 36.

Next, the photosensitive epoxy resin is coated on the second resin insulating layers 35 and 36 and is allowed to cure, thereby forming the solder resists 37 and 38. Next, exposure and development are carried out in a state in which a predetermined mask is disposed, thereby patterning the opening portions 40 and 46 in the solder resists 37 and 38. Further, the solder bumps 45 are respectively formed on the terminal pads 44, and the solder bumps 49 are respectively formed on the BGA pads 48. In consequence, the wiring board 10 constituted by the board core 11 and the buildup layers 31 and 32 is completed.

Therefore, according to this embodiment, it is possible to obtain the following advantages.

(1) In this embodiment, the obverse surface-side inductor pattern 251 which is an inductor is formed on the ceramic capacitor 101 itself. For this reason, for example, it is possible to configure a portion or all of a circuit of a various kind within the ceramic capacitor 101. To cite a specific example of it, if an unillustrated resistor is provided on the wiring board 10 side (on the surface layer or in the interior of each of the buildup layers 31 and 32, or on the surface layer of the board core 11), and that resistor and the obverse surface-side inductor pattern 251 are electrically connected, it is possible to configure a filter circuit or the like relatively easily. Accordingly, as compared with the conventional structure in which the inductor is mounted on the surface layer portion of the wiring board, multifunctional and high-performance features become easily attainable. In addition, since there is no need to newly set a parts mounting space for an inductor on the surface layer portion of the wiring board, it is possible to obtain a wiring board 10 which is less susceptible to the restriction in realizing a further compact size, and which is suitable for making the overall size structurally compact. Further, since the inductor mounting step can be omitted, it is possible to obtain a wiring board 10 which makes it possible to avoid an increase in the number of manufacturing steps, and which is suitable for attaining low cost and short delivery. In addition, according to this embodiment, since a structure is adopted in which, in the first place, the inductor is integrally formed with the ceramic capacitor 101 itself, the reliability can be improved positively as compared with the conventional structure in which the inductor is joined by soldering or the like.

(1') In this embodiment, the obverse surface-side resistor pattern 301 which is a resistor is formed on the ceramic capacitor 1101 itself, so that it is possible to set, for example, different potentials within the identical ceramic capacitor 1101. Accordingly, as compared with the conventional structure in which the resistor is mounted on the surface layer portion of the wiring board, multifunctional and high-performance features become easily attainable. In addition, since there is no need to newly set a parts mounting space for a resistor on the surface layer portion of the wiring board, it is possible to obtain a wiring board 110 which is less susceptible to the restriction in realizing a further compact size, and which is suitable for making the overall size structurally compact. Further, since the resistor mounting step can be omitted, it is possible to obtain a wiring board 110 which makes it possible to avoid an increase in the number of manufacturing steps, and which is suitable for attaining low cost and short delivery. In addition, according to this embodiment, since a structure is adopted in which, in the first place, the resistor is integrally formed with the ceramic capacitor 1101 itself, the reliability can be improved positively as compared with the conventional structure in which the resistor is joined by soldering or the like.

(2) According to the wiring board 10 or 110 of this embodiment, even in a case where the power supply systems of the two processor cores 24 and 25 cannot be made common, and the power supply systems should be set for the respective processor cores 24 nod 25, the two capacitor function portions 107 and 108 can be electrically connected to the two processor cores 24 and 25, respectively, so that it is possible to allow the individual processor cores 24 and 25 to operate sufficiently. Accordingly, in cases where the multi-core microprocessor structure such as the one in this embodiment is adopted, its advantages can be exploited to a maximum.

(3) In this embodiment, since the IC chip mounting region 23 of the IC chip 21 is located in a region immediately above the ceramic capacitor 101 or 1101, the IC chip 21 mounted on the IC chip mounting region 23 is supported by the ceramic capacitor 101 or 1101 which is highly rigid and has a small coefficient of thermal expansion. Hence, in the above-described IC chip mounting region 23, the first buildup layer 31 is difficult to be deformed, so that the IC chip 21 mounted on the IC chip mounting region 23 can be supported more stably. Accordingly, it is possible to prevent cracks and faulty connection of the IC chip 21 ascribable to a large thermal stress. Therefore, as the IC chip 21, it is possible to use a large-sized IC chip of 100 mm square or more, in which the stress (distortion) due to the difference in thermal expansion becomes large and the effect of thermal stress is large, and in which the amount of heat generated is large and the thermal shock during use is severe, as well as a low-k (low dielectric constant) IC chip which is considered to be brittle.

Furthermore, since the ceramic capacitor 101, 1101 in accordance with this embodiment has the two capacitor function portions 107 and 108, satisfactory power supply to the respective processor cores 24 and 25 can be attained by removing noise by the capacitor function portions 107 and 108. Moreover, the respective processor cores 24 and 25 are respectively disposed immediately above the capacitor function portions 107 and 108. Consequently, conductive routes (capacitor connection wiring) for electrically connecting the respective processor cores 24 and 25 and the respective capacitor function portions 107 and 108 become shortest. Therefore, power supply to the processor cores 24 and 25 can be effected smoothly. In addition, since the noise which enters between the IC chip 21 and the ceramic capacitor 101, 1101 can be suppressed to a very small level, malfunctions such as erroneous operation do not occur, and high reliability can be obtained.

(4) In the paragraph [0063] of JP-A-2002-43754 discloses a technique for embedding a plurality of chip capacitors in a board core. However, to embed the plurality of chip capacitors, the accommodating hole portions 90 in a number identical to that of the chip capacitors must be provided in the board core 11; therefore, the fabrication of the board core 11 and, hence, the manufacture of the wiring board 10, 110 are difficult. In addition, in the chip capacitors, even if a plurality of them are present, it is difficult to attain high performance based on such as the stabilization of the power supply. Further, since the area of the upper surface of the chip capacitor is much smaller than the area of the IC chip mounting region 23, it is impossible to allow the chip capacitor to function as a support for the IC chip 21. As a result, since matching of the coefficient of thermal expansion cannot be established between the IC chip 21 and the wiring board 10 or 110, a large thermal stress acts in the IC chip 21, so that cracks and faulty connection are likely to occur in the IC chip 21.

On the other hand, in this embodiment, since not a plurality of chip capacitors but one ceramic capacitor 101, 1101 is used, it suffices to provide only one accommodating hole portion 90 in the board core 11. Hence, since the process at the time of incorporation of the ceramic capacitor 101, 1101 is simplified, the wiring board 10, 110 can be easily manufactured, and it becomes possible to attain low cost. In addition, since not a chip capacitor but the ceramic capacitor 101, 1101 of the via array type with a large electrostatic capacity is used, it is easily possible to attain high performance. Further, in this embodiment, the area of the IC chip mounting region 23 is set to be smaller than the area of the upper surface 102 of the ceramic capacitor 101, 1101. In other words, the ceramic capacitor 101, 1101 having a wider area than the IC chip mounting region 23 is sued. Moreover, when viewed from the thicknesswise direction, the IC chip mounting region 23 is located within the upper surface 102 of the ceramic capacitor 101, 1101. Accordingly, it is possible to allow one ceramic capacitor 101, 1101 to function as a support for the IC chip 21. Therefore, it is possible to prevent cracks and faulty connection of the IC chip 21 ascribable to a large thermal stress.

(5) In the capacitor function portion 107 in accordance with this embodiment, the plurality of first power supplying via conductors 131 and the plurality of first grounding via conductors 132 are disposed in the form of arrays as a whole. Similarly, in the capacitor function portion 108 in accordance with this embodiment, the plurality of second power supplying via conductors 133 and the plurality of second grounding via conductors 134 are disposed in the form of arrays as a whole. Namely, the ceramic capacitor 101 in accordance with this embodiment is a via array-type capacitor. For this reason, it is easily possible to attain a compact size of the ceramic capacitor 101 itself, and hence attain a compact size of the overall wiring board 10. Moreover, a high electrostatic capacity is easily attainable despite the compact size, and power supply becomes possible on a more stable basis.

(5') For example, it is conceivable to use a chip capacitor instead of the ceramic capacitor 1101 and dispose that chip capacitor on the reverse side of the IC chip 21 (on the obverse surface side of the second buildup layer 32) in the wiring board 110. In this case, the inductance of the chip capacitor becomes 7.2 pH, and the inductance of the electrical path connecting the chip capacitor and the IC chip 21 becomes 2.8 pH, so that the total inductance becomes 10.0 pH and disadvantageously large.

On the other hand, in this embodiment, the ceramic capacitor 1101 with a lower inductance (1.2 pH) than that of the chip capacitor is used. Moreover, since the ceramic capacitor 1101 is embedded in the board core 11, the electrical path connecting the ceramic capacitor 1101 and the IC chip 21 becomes shorter than the electrical path connecting the chip capacitor and the IC chip 21. For this reason, the inductance of the electrical path also becomes low at 0.6 pH. As a result, since the total inductance becomes 1.8 pH, the inductance component can be decreased as compared with the case where the chip capacitor is used. As a result, it becomes possible to effect the power supply smoothly and suppress the generation of noise.

Next, a description will be given of the method of manufacturing the wiring board 110 in accordance with this embodiment. In the following description, same explanations as those of the wiring board 10 will be omitted, and only point differently from that of the wiring board 10 will be explained.

According to this embodiment, it is possible to obtain the following advantage.

Figure 31:
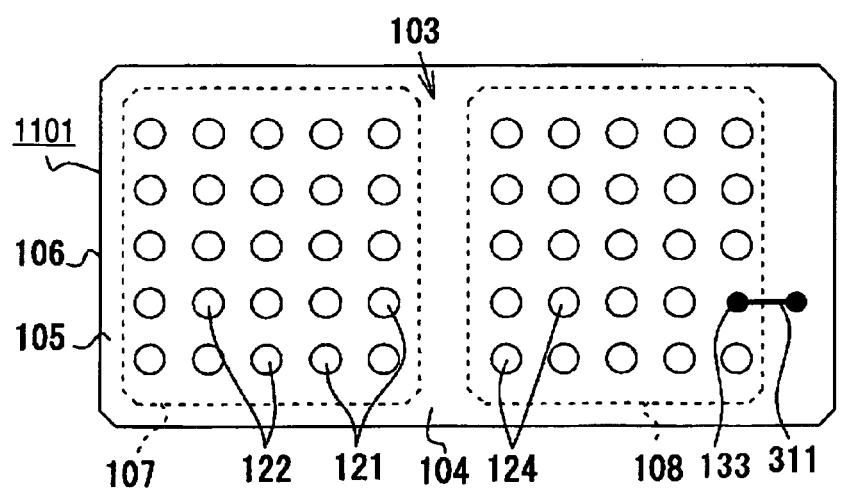
FIG. 31 is a schematic bottom view for explaining the appearance of a lower surface of the ceramic capacitor in accordance with a modification of the first embodiment.
Figure 32:
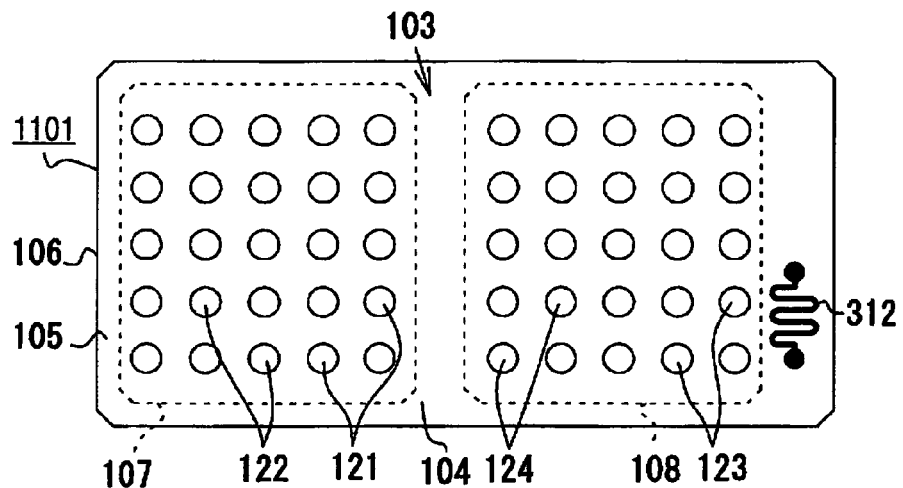
FIG. 32 is a schematic bottom view for explaining the appearance of the lower surface of the ceramic capacitor in accordance with the modification of the first embodiment.

(1) The ceramic capacitor 1101 in accordance with this embodiment may be modified as follows. For example, in a modification shown in FIG. 31, a reverse surface-side resistor pattern 311, which is a resistor and is constituted by a rectilinear pattern, is formed on the lower surface 103 (on the reverse surface of the capacitor). In addition, in another modification shown in FIG. 32, a reverse surface-side resistor pattern 312, which is constituted by a meandering linear pattern, is formed on the lower surface 103. These reverse surface-side resistor patterns 311 and 312 are formed of the same material as that of the electrode terminals 121 to 124 on the upper surface 102 by using nickel as a principal constituent, and their surfaces are coated by an unillustrated copper plating layer.

Second Embodiment

Referring now to FIGS. 9 to 12, a detailed description will be given of the ceramic capacitor in accordance with a second embodiment of the invention.

Figure 9:
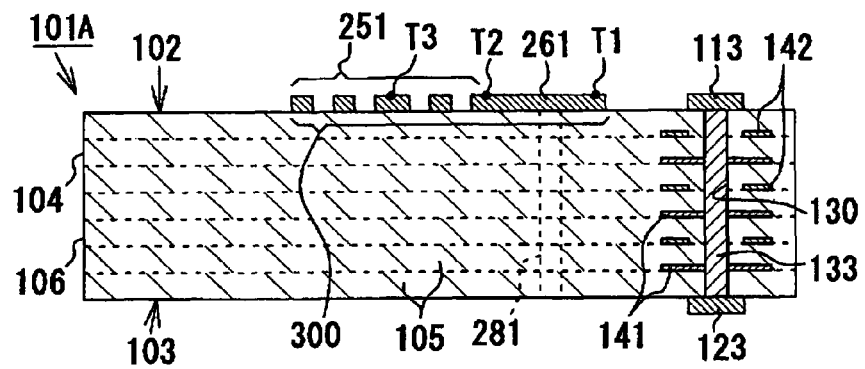
FIG. 9 is a schematic cross-sectional view illustrating the ceramic capacitor in accordance with a second embodiment.
Figure 10:
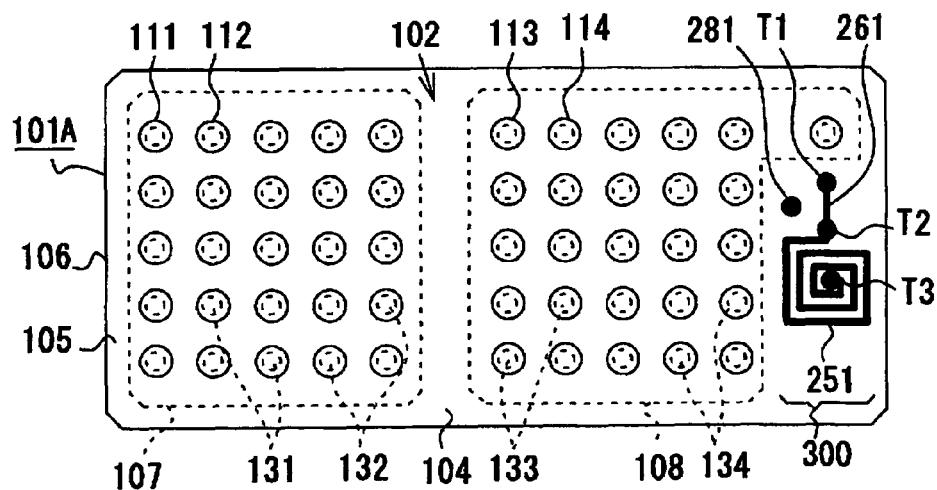
FIG. 10 is a schematic plan view for explaining the appearance of the upper surface of the ceramic capacitor in accordance with the second embodiment.

A ceramic capacitor 101A in accordance with this embodiment shown in FIGS. 9 and 10 has the obverse surface-side inductor pattern 251 serving as an inductor in the same way as in the first embodiment. This obverse surface-side inductor pattern 251 is disposed in a region located outside the capacitor function portions 107 and 108 on the upper surface 102 of the ceramic capacitor 101A. An obverse surface-side resistor pattern 261 serving as a resistor is formed in that region in the vicinity of the obverse surface-side inductor pattern 251. The obverse surface-side resistor pattern 261 in this embodiment is a rectilinear pattern, but may be a meandering linear pattern. A via conductor 281 for a signal line providing communication between the upper surface 102 and the lower surface 103 of the ceramic capacitor 101A is disposed in that region in the vicinity of the obverse surface-side inductor pattern 251 and the obverse surface-side resistor pattern 261. The obverse surface-side inductor pattern 251 and the obverse surface-side resistor pattern 261 in accordance with this embodiment are formed by using nickel as a principal constituent, and their surfaces are coated by an unillustrated copper plating layer. In other words, the obverse surface-side inductor pattern 251 and the obverse surface-side resistor pattern 261 in accordance with this embodiment are formed of the same material as that of the electrode terminals 111 to 114 on the upper surface 102.

Figure 11:
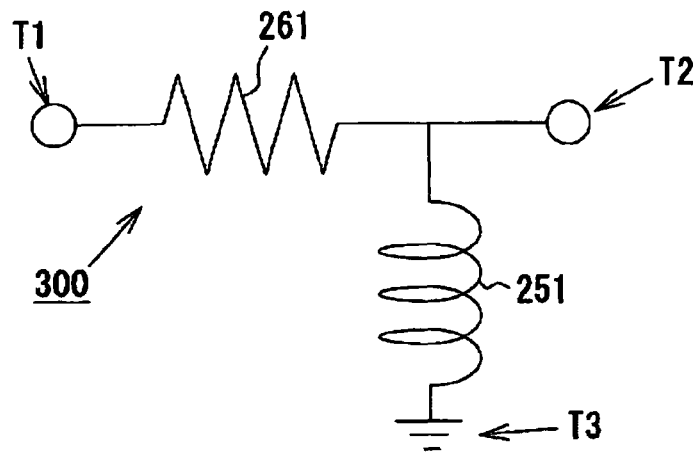
FIG. 11 is a schematic diagram for explaining a circuit portion configured in the ceramic capacitor in accordance with the second embodiment.
Figure 12:
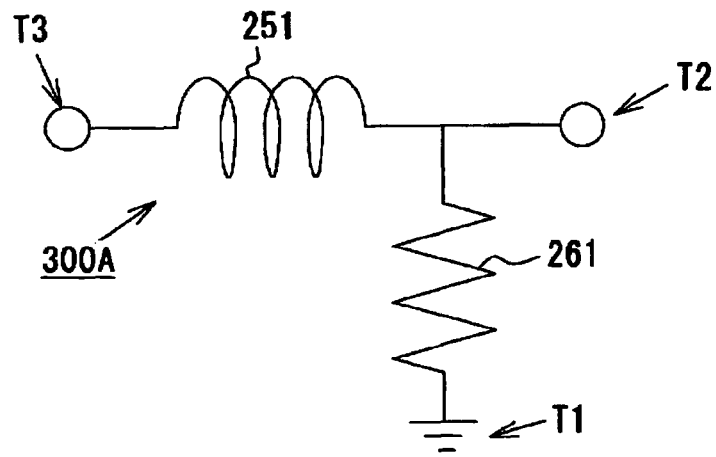
FIG. 12 is a schematic diagram for explaining a circuit portion configured in the ceramic capacitor in accordance with the second embodiment.

As shown in FIGS. 9 and 10, in this embodiment one terminal of the obverse surface-side resistor pattern 261 and an outer end of the obverse surface-side inductor pattern 251 are electrically connected. A point of their connection is set as a "terminal T2" for convenience' sake. The remaining terminal T1 of the obverse surface-side resistor pattern 261 is electrically connected to the via conductor on the wiring board 10 side, and an inner end (terminal T3) of the obverse surface-side inductor pattern 251 is similarly electrically connected to another via conductor on the wiring board 10 side. Accordingly, by the combination of these two passive elements, one circuit portion 300 (filter circuit) is formed on the ceramic capacitor 101A. For example, if the form of connection shown in FIG. 11 is adopted, that filter circuit 300 can be made to function as a so-called high pass filter. Meanwhile, if the form of connection shown in FIG. 12 is adopted, a filter circuit 300A can be made to function as a so-called low pass filter.

As described above, according to this embodiment, as a result of the fact that a filter function is imparted to the capacitor 101A, the multifunction can be attained reliably. Therefore, by configuring the wiring board 10 by using the capacitor 101A with a filter circuit, it is possible to attain reduction in noise.

Third Embodiment

Figure 13:
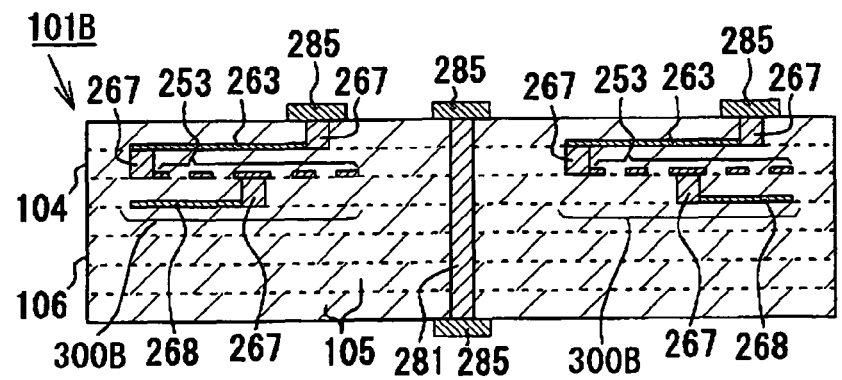
FIG. 13 is a schematic cross-sectional view illustrating the ceramic capacitor in accordance with a third embodiment.

Referring now to FIG. 13, a detailed description will be given of the ceramic capacitor in accordance with a third embodiment of the invention.

In the second embodiment, one circuit portion 300 or 300A (filter circuit) is formed on the upper surface 102 of the ceramic capacitor 101. In contrast, in this embodiment shown in FIG. 13, two circuit portions 300B (filter circuits) are formed inside a ceramic capacitor 101B. Specifically, a resistor constituting the circuit portion 300B is an inner layer resistor pattern 263. One end of the inner layer resistor pattern 263 is electrically connected to a predetermined terminal portion 285 located on the surface layer through an interlayer-connecting via conductor 267. A loop-shaped inner layer inductor pattern 253 is formed in a layer underneath the layer where the inner layer resistor pattern 263 is formed. An outer end of the inner layer inductor pattern 253 is electrically connected to the remaining end of the inner layer resistor pattern 263. A grounding plain conductor layer 268 is formed in a layer underneath the layer where the inner layer inductor pattern 253 is formed. An inner end of the inner layer inductor pattern 253 is electrically connected to the grounding plain conductor layer 268 through the interlayer connecting via conductor 267. It should be noted that the grounding plain conductor layer 268 may be common to the two circuit portions 300B, or may be set separately.

As described above, according to this embodiment, as a result of the fact that two filter circuits are provided in the capacitor 101B, the multifunction can be attained reliably. Therefore, by configuring the wiring board 10 by using the capacitor 101B with filter circuits, it is possible to attain reduction in noise.

Fourth Embodiment

Figure 14:
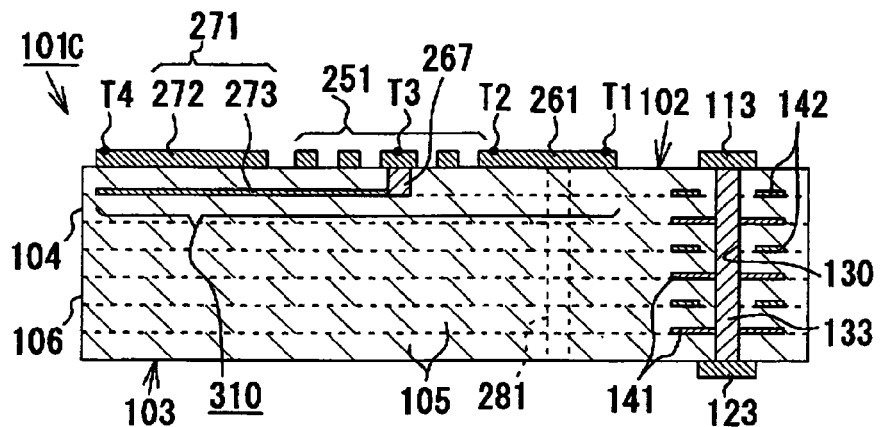
FIG. 14 is a schematic cross-sectional view illustrating the ceramic capacitor in accordance with a fourth embodiment.
Figure 15:
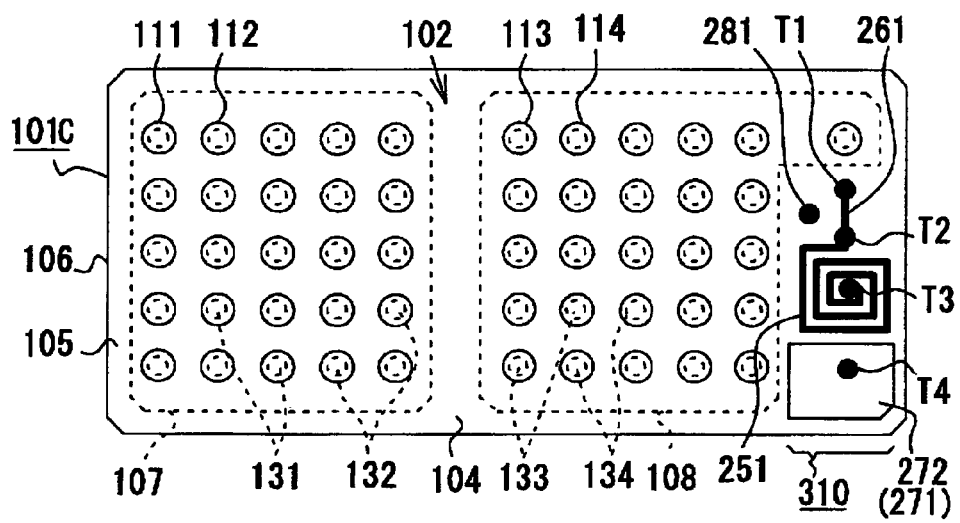
FIG. 15 is a schematic plan view for explaining the appearance of the upper surface of the ceramic capacitor in accordance with the fourth embodiment.
Figure 16:
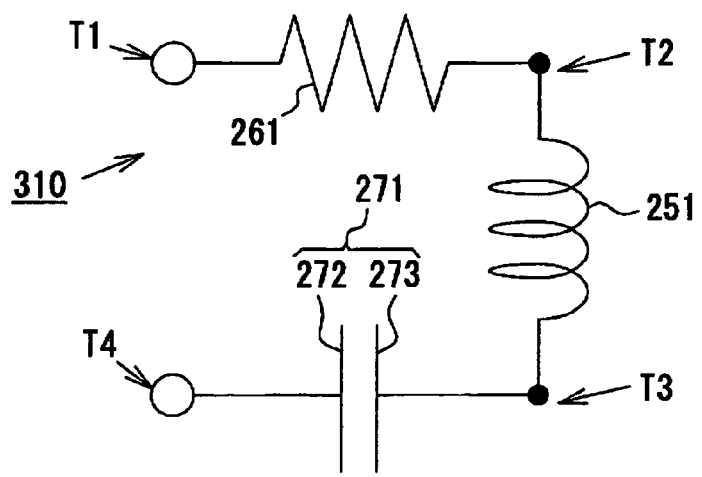
FIG. 16 is a schematic diagram for explaining a circuit portion configured in the ceramic capacitor in accordance with the fourth embodiment.

Referring now to FIGS. 14 to 16, a detailed description will be given of the ceramic capacitor in accordance with a fourth embodiment of the invention.

As shown in FIGS. 14 and 15, a ceramic capacitor 101C in accordance with this embodiment is further provided with a capacitor 271 in the vicinity of the obverse surface-side inductor pattern 251 and the obverse surface-side resistor pattern 261 described in the second embodiment. This capacitor 271 is formed by a pair of a first electrode 272 formed on the upper surface 102 and a second electrode 273 formed on a layer immediately below the first electrode 272 with the ceramic dielectric layer 105 interposed therebetween. The first electrode 272 and the second electrode 273 are substantially rectangular conductor patterns in a plan view, but the shape of the patterns may be altered arbitrarily.

The inner end of the obverse surface-side inductor pattern 251 is electrically connected to the second electrode 273 through the interlayer connecting via conductor 267. Here, a point of their connection is set as a "terminal T3" for convenience's sake. It is assumed that a "terminal T4" is on a first electrode 274.

Accordingly, in this embodiment, one circuit portion 310 (tuning circuit, see FIG. 16) is configured on the ceramic capacitor 101C by the combination of these three passive elements.

As described above, according to this embodiment, as a result of the fact that the function of a tuning circuit is imparted to the capacitor 101C, the multifunction can be attained reliably. Therefore, by configuring the wiring board 10 by using the capacitor 101C with a tuning circuit, it becomes possible to realize wireless communication with other wiring boards.

It should be noted that the embodiments of the invention may be modified as shown below.

Figure 17:
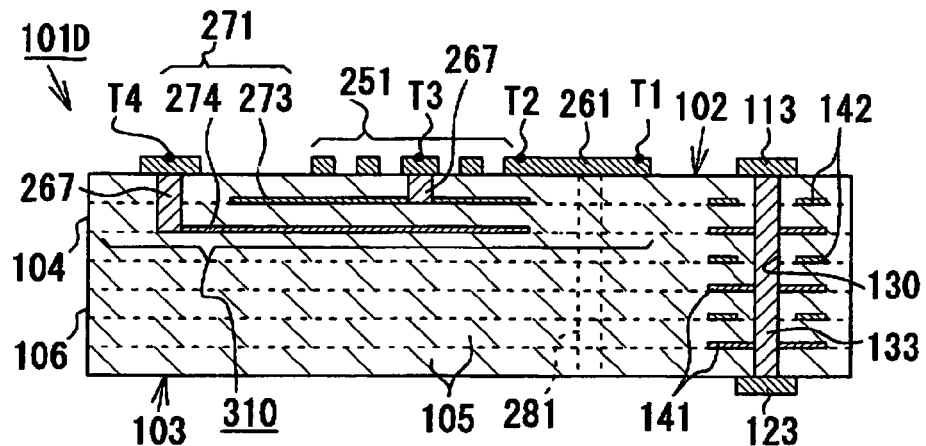
FIG. 17 is a schematic cross-sectional view illustrating another example of the ceramic capacitor.

As in the case of a ceramic capacitor 101D in another example shown in FIG. 17, both the first electrode 274 and the second electrode 273 constituting the capacitor 271 may be formed on an inner layer.

Figure 18:
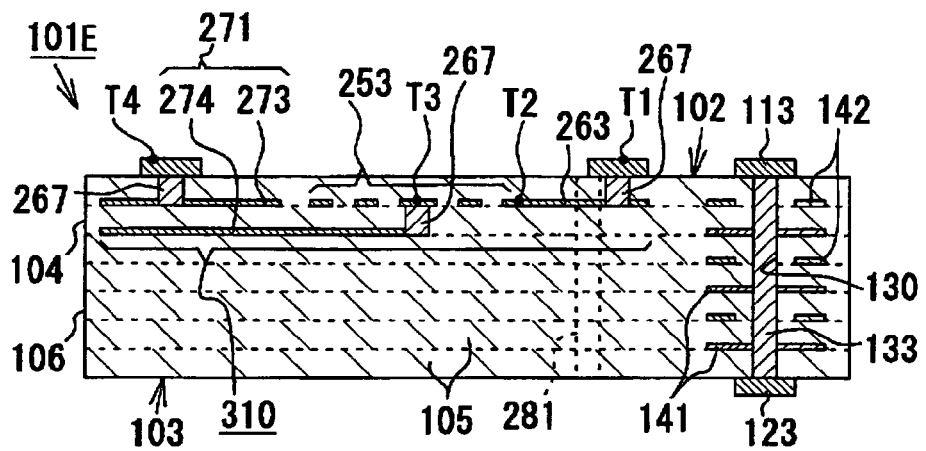
FIG. 18 is a schematic cross-sectional view illustrating still another example of the ceramic capacitor.
Figure 19:
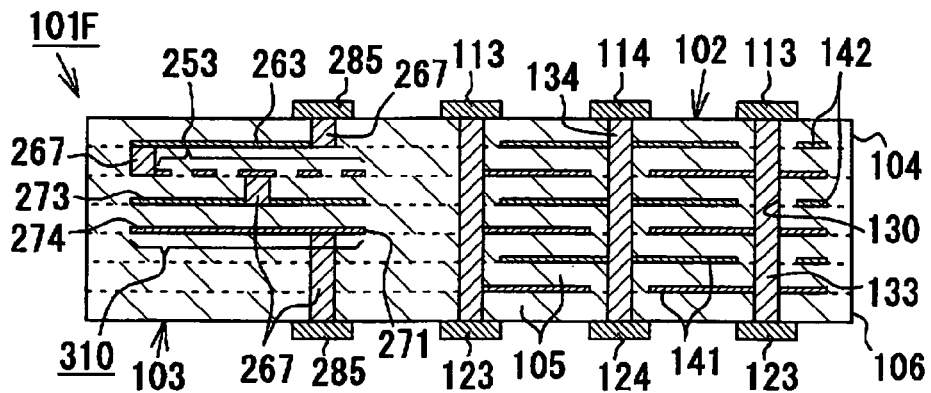
FIG. 19 is a schematic cross-sectional view illustrating a further example of the ceramic capacitor.

As in the case of a ceramic capacitor 101E in still another example shown in FIG. 18, all the passive elements (the inner layer resistor pattern 263, i.e., a resistor, the inner layer inductor pattern 253, i.e., an inductor, and the capacitor 271) constituting the circuit portion 310 (tuning circuit) may be formed on an inner layer. In addition, as in the case of a ceramic capacitor 101F in a further example shown in FIG. 19, the aforementioned passive elements may be laminated and arranged in the thicknesswise direction of the ceramic capacitor 101F.

Figure 20:
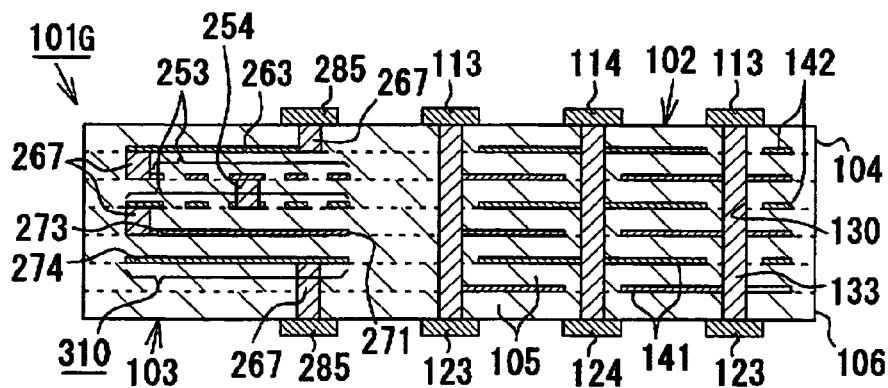
FIG. 20 is a schematic cross-sectional view illustrating a still further example of the ceramic capacitor.

As in the case of a ceramic capacitor 101G in a still further example shown in FIG. 20, two inner layer inductor patterns 253 may be respectively formed on two different layers in the interior of the capacitor 101G, and these inductor patterns may be electrically connected to each other via an inductor connecting via conductor 254. If such a structure is adopted, the two inner layer inductor patterns 253 disposed with the ceramic dielectric layer 105 interposed therebetween are connected together, and can be made to function as one inductor having a high inductance.

Figure 21:
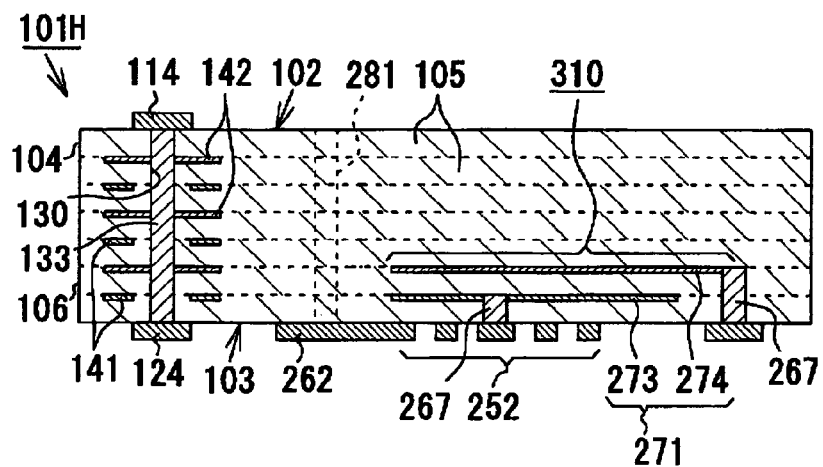
FIG. 21 is a schematic cross-sectional view illustrating a further example of the ceramic capacitor.

As in the case of a ceramic capacitor 101H in a further example shown in FIG. 21, some of the passive elements constituting the circuit portion 310 (tuning circuit) may be disposed on the lower surface 103 of the ceramic capacitor 101H. It should be noted that the circuit portion 310 of this ceramic capacitor 101H are constituted by a reverse surface-side resistor pattern 262, an obverse surface-side inductor pattern 252, i.e., an inductor, and the capacitor 271.

Figure 22:
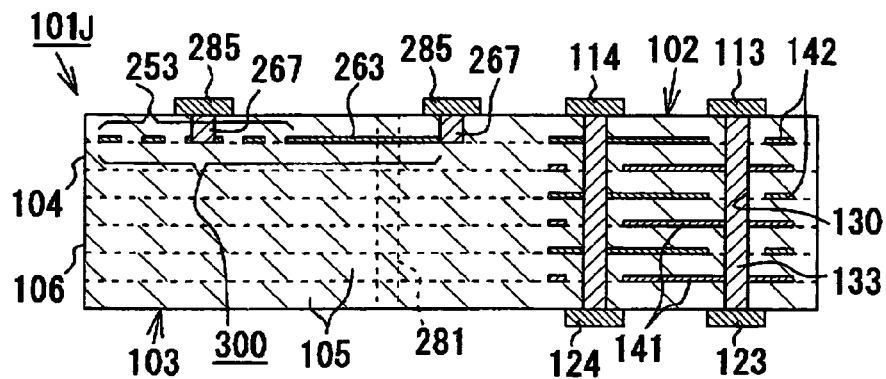
FIG. 22 is a schematic cross-sectional view illustrating a further example of the ceramic capacitor.

As in the case of a ceramic capacitor 101J in a further example shown in FIG. 22, the passive elements (the inner layer resistor pattern 263, i.e., a resistor, and the inner layer inductor pattern 253, i.e., an inductor) constituting the circuit portion 300 (filter circuit) may be formed on an inner layer of the ceramic capacitor 101J.

The accommodating hole portion 90 in each of the above-described embodiments is a through hole which is open at the upper surface 12 and the lower surface 13. However, the accommodating hole portion 90 may be a bottomed recessed portion (non-through hole portion) which is open only at the upper surface 12 of the board core 11.

A wiring pattern (inner layer pattern) may be formed inside the board core 11 in each of the above-described embodiments. If such a structure is adopted, since a complex electrical circuit can be formed inside the wiring board 10, it is possible to attain further sophisticated performance of the wiring board 10. Further, the board core 11 may be formed by laminating thin insulating layers on the core.

Although in the above-described embodiments, the invention is embodied as the capacitor 101 having the plurality of capacitor function portions 107 and 108, the invention may, of course, be embodied as a capacitor having only one capacitor function portion.

Next, technical concepts which can be understood by the foregoing embodiments will be enumerated below.

(1) A ceramic capacitor having a capacitor main surface and a capacitor reverse surface and having a structure in which first inner electrode layers and second inner electrode layers are alternately laminated and arranged via a ceramic dielectric layer, wherein an inductor is integrally formed with the ceramic dielectric layer.

(2) A ceramic capacitor having a capacitor main surface and a capacitor reverse surface and having a structure in which first inner electrode layers and second inner electrode layers are alternately laminated and arranged via a ceramic dielectric layer, comprising: a plurality of power supplying via conductors for allowing the first inner electrode layers to conduct with each other; a plurality of grounding via conductors for allowing the second inner electrode layers to conduct with each other; power supplying electrode terminals respectively located at end portions of the plurality of power supplying via conductors; grounding electrode terminals respectively located at end portions of the plurality of grounding via conductors; and an inductor formed integrally with the ceramic dielectric layer, wherein the plurality of power supplying via conductors and the plurality of grounding via conductors are disposed in the form of arrays.

(3) A wiring board comprising: a board core having a core main surface and a core reverse surface; a ceramic capacitor having a capacitor main surface and a capacitor reverse surface and having a structure in which first inner electrode layers and second inner electrode layers are alternately laminated and arranged via a ceramic dielectric layer, the ceramic capacitor having a plurality of capacitor function portions which are electrically independent of each other, the ceramic capacitor being embedded in the board core in a state in which the core main surface and the capacitor main surface are oriented on the same side; and a buildup layer having a structure in which interlayer insulating layers and conductor layers are alternately laminated on the core main surface and the capacitor main surface, a semiconductor integrated circuit device mounting region being set on a surface of the buildup layer to allow a semiconductor integrated circuit device having a plurality of processor cores to be mounted thereon, wherein the plurality of capacitor function portions are respectively electrically connectable to the plurality of processor cores, and an inductor is formed in the ceramic capacitor.

Fifth Embodiment

Figure 33:
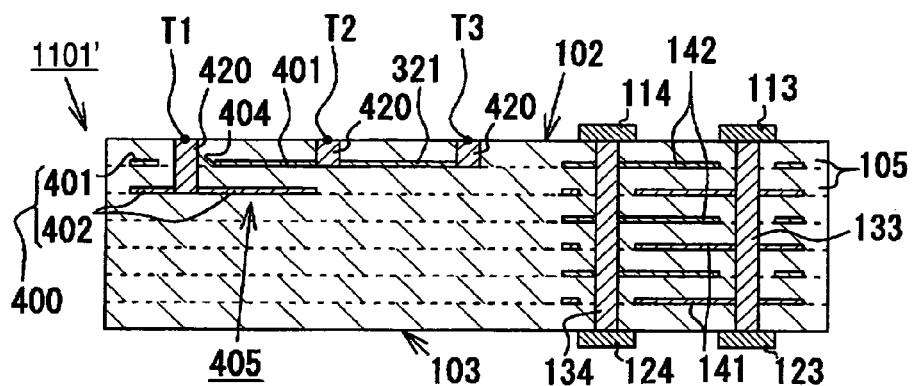
FIG. 33 is a schematic cross-sectional view illustrating the ceramic capacitor in accordance with a fifth embodiment.
Figure 34:
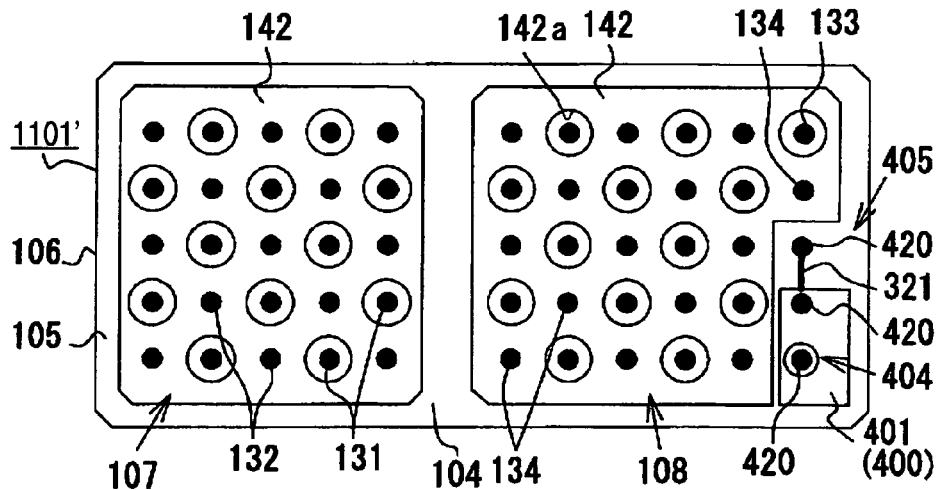
FIG. 34 is an explanatory schematic diagram for explaining the connection in the inner layer of the ceramic capacitor in accordance with the fifth embodiment.
Figure 35:
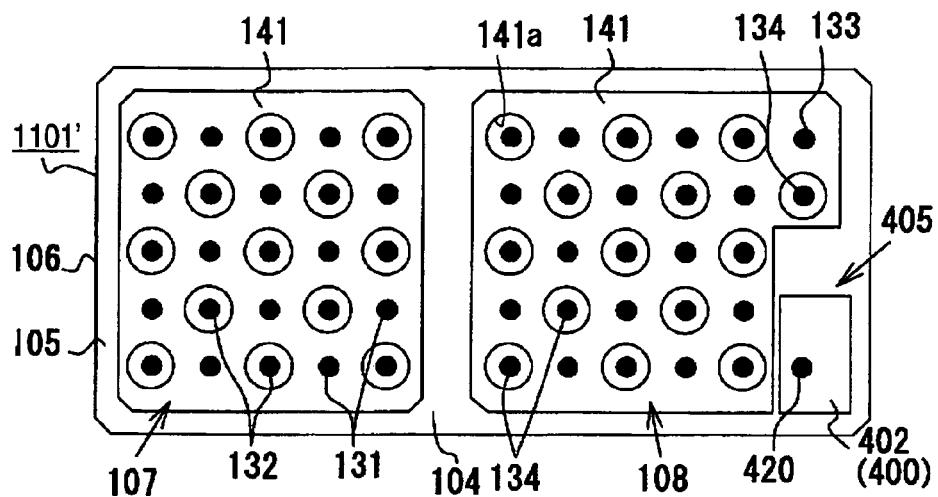
FIG. 35 is an explanatory schematic diagram for explaining the connection in the inner layer of the ceramic capacitor in accordance with the fifth embodiment.

Referring now to FIGS. 33 to 35, a detailed description will be given of the wiring board in accordance with a fifth embodiment of the invention.

The ceramic capacitor 1101' in accordance with this embodiment shown in FIGS. 33 to 35 differs from the above-described first embodiment in that a resistor and a capacitor 400 are provided therein. In this ceramic capacitor 1101', an inner layer resistor pattern 321 serving as a resistor is formed at an interface between the first ceramic dielectric layer 105 and the second ceramic dielectric layer 105 (see FIG. 34). This inner layer resistor pattern 321 is formed of the same material as that of the first inner electrode layer 141 and the second inner electrode layer 142. It should be noted that although the inner layer resistor pattern 321 constituted by a rectilinear pattern is shown in FIG. 34, the inner layer resistor pattern 321 may be a meandering linear pattern. Via conductors 420 are respectively disposed at positions where both end portions of the inner layer resistor pattern 321 are located, and the exposed end portions of these via conductors 420 are respectively used as the terminals T2 and T3.

In addition, a first electrode 401 constituting the capacitor 400 is similarly formed adjacent to the inner layer resistor pattern 321 at the interface between the first ceramic dielectric layer 105 and the second ceramic dielectric layer 105 (see FIG. 34). The first electrode 401 is also formed of the same material as that of the first inner electrode layer 141 and the second inner electrode layer 142. The first electrode 401 is a rectangular conductor pattern, and has a circular clearance hole 404 in a substantially central portion thereof.

A second electrode 402 constituting the capacitor 400 is formed at a position immediately below the first electrode 401 at the interface between the second ceramic dielectric layer 105 and the third ceramic dielectric layer 105 (see FIG. 35). The second electrode 402 is also formed of the same material as that of the first inner electrode layer 141 and the second inner electrode layer 142. The second electrode 402 is a rectangular conductor pattern, and the via conductor 420 is connected to its upper surface side. This via conductor 420 is disposed in such a manner as to penetrate the aforementioned clearance hole 404, and its end portion exposed at the upper surface 12 is used as the terminal T1.

Figure 36:
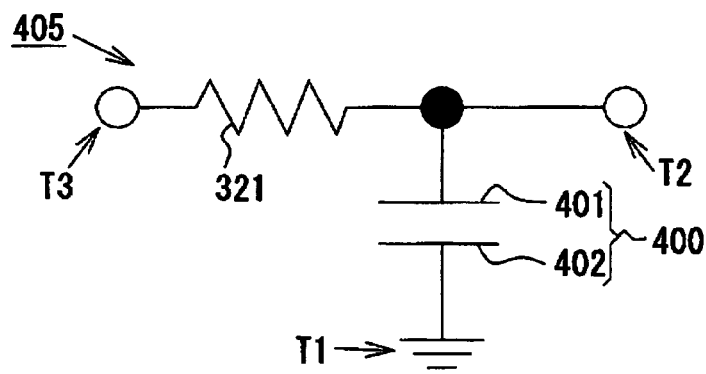
FIG. 36 is a schematic diagram for explaining a circuit portion configured by the ceramic capacitor in accordance with the fifth embodiment.
Figure 37:
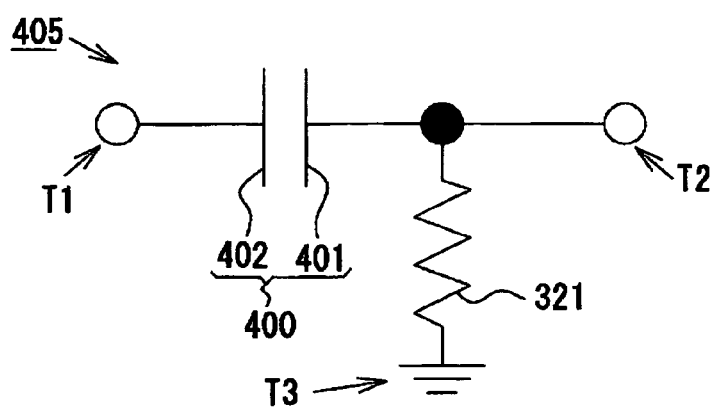
FIG. 37 is a schematic diagram for explaining a circuit portion configured by the ceramic capacitor in accordance with the fifth embodiment.

The inner layer resistor pattern 321 and the capacitor 400 are electrically connected to each other, and a filter circuit 405 serving as a circuit portion is formed inside the ceramic capacitor 1101' by this connection. For example, if the form of connection shown in FIG. 36 is adopted, that filter circuit 405 can be made to function as a so-called low pass filter. Meanwhile, if the form of connection shown in FIG. 37 is adopted, that filter circuit 405 can be made to function as a so-called high pass filter.

As described above, according to this embodiment, as a result of the fact that a filter function is imparted to the capacitor 1101', the multifunction can be attained. Therefore, by configuring the wiring board 110 by using the capacitor 1101' with the filter circuit 405, it is possible to attain reduction in noise.

Sixth Embodiment

Figure 38:
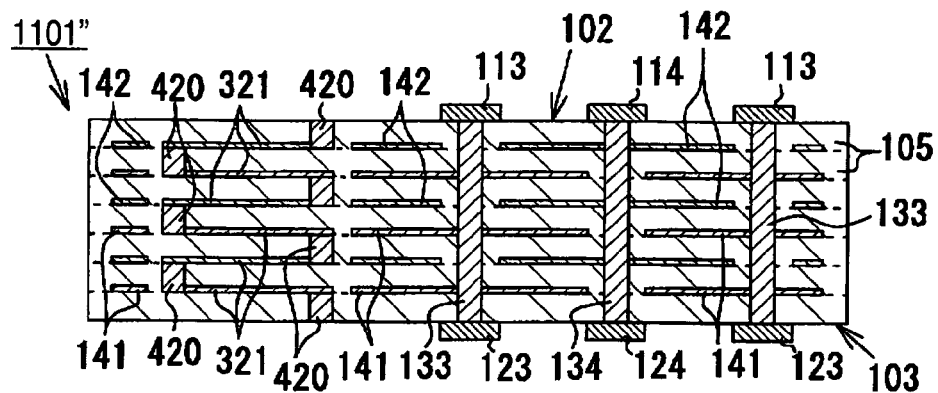
FIG. 38 is a schematic cross-sectional view illustrating the ceramic capacitor in accordance with a sixth embodiment.
Figure 39:
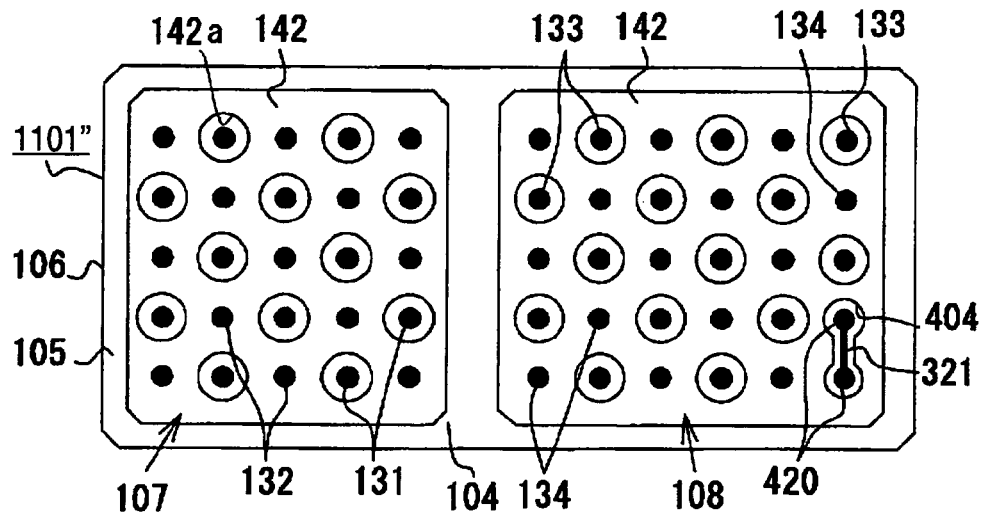
FIG. 39 is an explanatory schematic diagram for explaining the connection in the inner layer of the ceramic capacitor in accordance with the sixth embodiment.

Referring now to FIGS. 38 and 39, a detailed description will be given of the wiring board in accordance with a sixth embodiment of the invention.

In the ceramic capacitor 1101" in accordance with this embodiment shown in FIGS. 38 and 39, the inner layer resistor patterns 321 are formed at a plurality of interfaces between the ceramic dielectric layers 105. Each of these inner layer resistor patterns 321 is disposed in an inner region of the first inner electrode layer 141 or the second inner electrode layer 142, but is located in the clearance hole 404 so as to avoid connection to the inner electrode layer. The inner layer resistor patterns 321 are connected to each other in series by the via conductor 420, and one large resistor is configured by this connection.

Even in the case where the capacitor 1101" having such a configuration is used, it is possible to obtain a compact-sized, multifunctional, and low-cost wiring board 110 in the same way as in the first embodiment.

Seventh Embodiment

Figure 40:
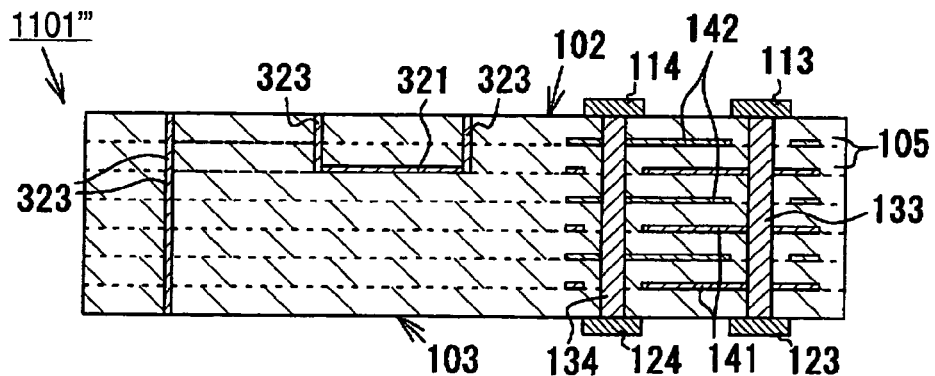
FIG. 40 is a schematic cross-sectional view illustrating the ceramic capacitor in accordance with a seventh embodiment.

Referring now to FIG. 40, a detailed description will be given of the wiring board in accordance with a seventh embodiment of the invention.

Via resistances 323 serving as resistors are formed at a plurality of portions in the ceramic dielectric layer 105 of the ceramic capacitor 1101''' in accordance with this embodiment shown in FIG. 40. These via resistances 323 have a smaller diameter (50 µmΦ to 80 µmΦ or thereabouts) than the via conductors 420 in the above-described embodiments, for example. For this reason, despite the fact that these via resistances 323 are formed of the same material as that of the via conductors 131 to 134 in the same way as the via conductors 420, these via resistances 323 are adapted to function as resistors. The plurality of via resistances 323 may be connected in series, but may be connected via the inner layer resistor pattern 321.

Even in the case where the capacitor 1101''' having such a configuration is used, it is possible to obtain a compact-sized, multifunctional, and low-cost wiring board 110 in the same way as in the first embodiment.

Eighth Embodiment

Figure 41:
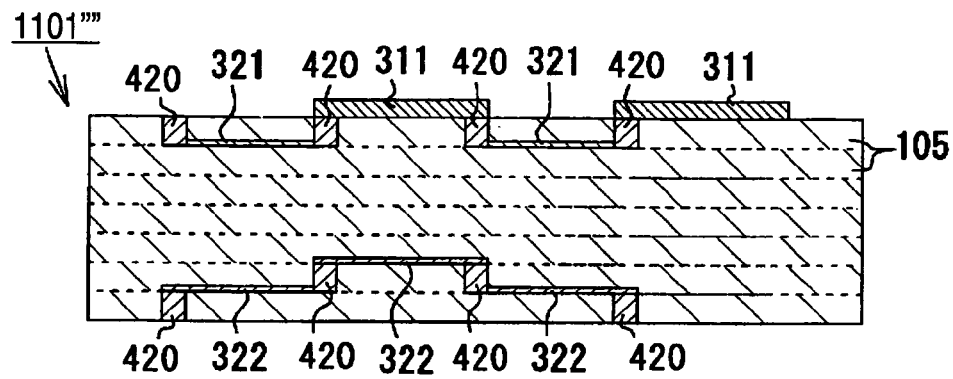
FIG. 41 is a schematic cross-sectional view illustrating the ceramic capacitor in accordance with an eighth embodiment.

Referring now to FIG. 41, a detailed description will be given of the wiring board in accordance with an eighth embodiment of the invention.

The ceramic capacitor 1101'''' in accordance with this embodiment shown in FIG. 41 has on its upper surface 12 side the plurality of obverse surface-side resistor patterns 311 and the plurality of inner layer resistor patterns 321, and these resistor patterns are connected in series via the via conductors 420. Further, this ceramic capacitor 1101'''' has on its lower surface 13 side a plurality of inner layer resistor patterns 322, which are connected in series via the via conductors 420.

Even in the case where the capacitor 1101'''' having such a configuration is used, it is possible to obtain a compact-sized, multifunctional, and low-cost wiring board 110 in the same way as in the first embodiment.

It should be noted that the embodiments of the invention may be modified as shown below.

The accommodating hole portion 90 in each of the above-described embodiments is a through hole which is open at the upper surface 12 and the lower surface 13. However, the accommodating hole portion 90 may be a bottomed recessed portion (non-through hole portion) which is open only at the upper surface 12 of the board core 11.

A wiring pattern (inner layer pattern) may be formed inside the board core 11 in each of the above-described embodiments. If such a structure is adopted, since a complex electrical circuit can be formed inside the wiring board 110, it is possible to attain further sophisticated performance of the wiring board 110. Further, the board core 11 may be formed by laminating thin insulating layers on the core.

Figure 42:
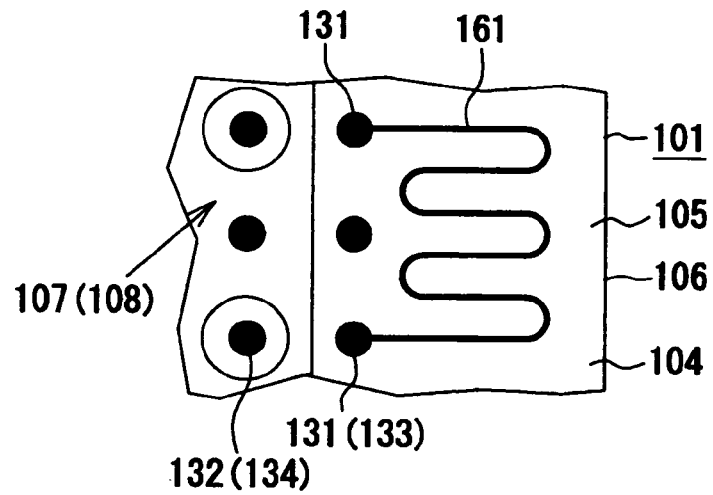
FIG. 42 is a schematic plan view illustrating the appearance in the vicinity of a resistor in the ceramic capacitor in accordance with a further example.
Figure 43:
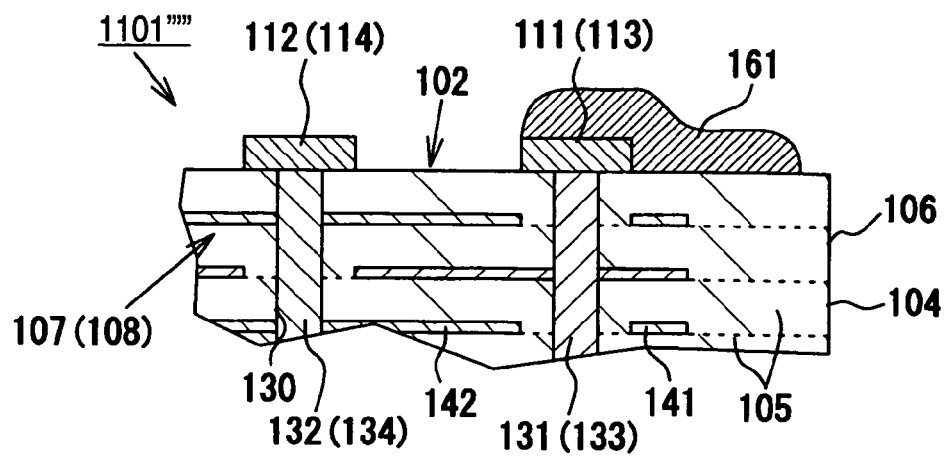
FIG. 43 is a schematic cross-sectional view illustrating the appearance in the vicinity of the resistor in the ceramic capacitor in accordance with the further example.
Figure 44:
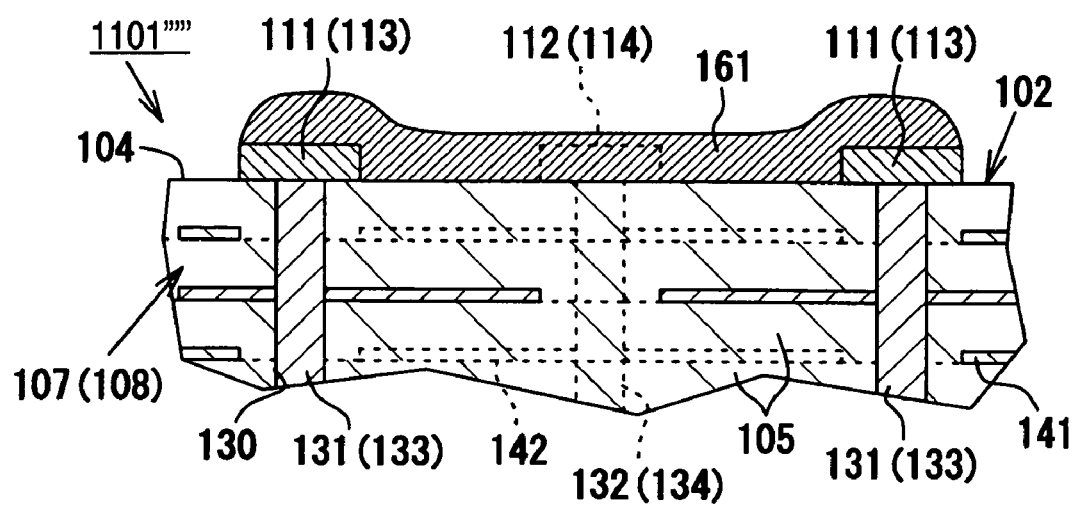
FIG. 44 is a schematic plan view illustrating the appearance in the vicinity of a resistor in the ceramic capacitor in accordance with the further example.

As shown in FIGS. 42 to 44, a sintered resistor pattern 161 serving as a resistor may be formed on such as the upper surface 102 of the ceramic capacitor 1101''''. For example, the sintered resistor pattern 161 electrically connects the first power supplying electrode terminal 111 (second power supplying electrode terminal 113) and other first power supplying electrode terminal 111 (second power supplying electrode terminal 113). It should be noted that the sintered resistor pattern 161 is formed of a ceramic or the like having a higher resistance value than the material constituting the power supplying electrode terminals 111 and 113, the first inner electrode layers 141, and the second inner electrode layers 142. It should be noted that this sintered resistor pattern 161 is formed by applying ceramic paste to the upper surface 102 side after completion of the ceramic capacitor 1101'''', by sintering it for a predetermined time, and by adjusting the resistance value by removing an unnecessary portion.

If such a configuration is adopted, it becomes possible to set, for example, different potentials within the ceramic capacitor 1101'''', so that it becomes easy to attain the high performance of the wiring board 110. Unless the resistor 161 is formed on the ceramic capacitor 1101'''', it becomes necessary to either embed the resistor within the board core 11 at a portion different from the ceramic capacitor 1101'''' or provide the resistor on the side of the buildup layer 31 or 32.

Although in the above-described embodiments, the invention is embodied as the capacitor 1101, 1101', 1101'', 1101''', 1101'''', 1101''''' having the plurality of capacitor function portions 107 and 108, the invention may, of course, be embodied as a capacitor having only one capacitor function portion.

Next, technical concepts which can be understood by the foregoing embodiments will be enumerated below.

(1) A wiring board comprising: a board core having a core main surface and a core reverse surface; a ceramic capacitor having a capacitor main surface and a capacitor reverse surface and having a structure in which first inner electrode layers and second inner electrode layers are alternately laminated and arranged via a ceramic dielectric layer, the ceramic capacitor being accommodated in the board core in a state in which the core main surface and the capacitor main surface are oriented on the same side; and a wiring laminated portion having a structure in which interlayer insulating layers and conductor layers are alternately laminated on the core main surface and the capacitor main surface, wherein a resistor is formed on the ceramic capacitor.

(2) A wiring board comprising: a board core having a core main surface and a core reverse surface; a ceramic capacitor having a capacitor main surface and a capacitor reverse surface and having a structure in which first inner electrode layers and second inner electrode layers are alternately laminated and arranged via a ceramic dielectric layer, the ceramic capacitor having a plurality of capacitor function portions which are electrically independent of each other, the ceramic capacitor being embedded in the board core in a state in which the core main surface and the capacitor main surface are oriented on the same side; and a wiring connecting portion having a structure in which interlayer insulating layers and conductor layers are alternately laminated on the core main surface and the capacitor main surface, a semiconductor integrated circuit device mounting region being set on a surface of the buildup layer to allow a semiconductor integrated circuit device having a plurality of processor cores to be mounted thereon, wherein a resistor is formed on the ceramic capacitor, the ceramic capacitor is disposed in the core board in a region corresponding to the semiconductor integrated circuit device mounting region, and the plurality of capacitor function portions are respectively electrically connectable to the plurality of processor cores.

This application is based on Japanese Patent application JP 2005-254030, filed Sep. 1, 2005, Japanese Patent application JP 2006-112262, filed Apr. 14, 2006, and Japanese Patent application JP 2006-168172, filed Jun. 16, 2006, the entire contents of which are hereby incorporated by reference, the same as if set forth at length.

What is claimed is:

1. A wiring board comprising:
   a board core having a core main surface and a core reverse surface;
   a capacitor having a capacitor main surface and a capacitor reverse surface and having a structure in which first inner electrode layers and second inner electrode layers are alternately laminated and arranged via a dielectric layer, the capacitor being accommodated in the board core in a state in which the core main surface and the capacitor main surface are oriented on a same side; and
   a wiring laminated portion having a structure in which interlayer insulating layers and conductor layers are alternately laminated on the core main surface and the capacitor main surface,
   wherein a first terminal is formed on the capacitor main surface and a second terminal is formed on the capacitor reverse surface,
   wherein each of an inductor and a resistor are formed on the capacitor main surface or in the capacitor, and a second capacitor is formed in the capacitor,
   wherein the resistor is electrically connected to the first terminal through a first interlayer-connecting via conductor, and
   wherein the second capacitor is electrically connected to the first terminal through the first interlayer-connecting via conductor or to the second terminal by a second interlayer-connecting via conductor.

2. The wiring board according to claim 1, wherein the capacitor includes:
   a plurality of power supplying via conductors for allowing the first inner electrode layers to conduct with each other;
   a plurality of grounding via conductors for allowing the second inner electrode layers to conduct with each other;
   power supplying electrode terminals respectively located at end portions of the plurality of power supplying via conductors; and grounding electrode terminals respectively located at end portions of the plurality of grounding via conductors wherein the plurality of power supplying via conductors and the plurality of grounding via conductors are disposed in the form of arrays.

3. The wiring board according to claim 1, wherein the wiring laminated portion is a first wiring laminated portion, and includes a second wiring laminated layer portion having a structure in which interlayer insulating layers and the conductor layers are alternately laminated on the core reverse surface and the capacitor reverse surface.

4. The wiring board according to claim 2, wherein the inductor is an obverse surface-side inductor pattern which is formed on the capacitor main surface from a same material as that of the power supplying electrode terminals and the grounding electrode terminals.

5. The wiring board according to claim 4, wherein the obverse surface-side inductor pattern is a loop-shaped pattern.

6. The wiring board according to claim 2, wherein the inductor is disposed in a region located outside a capacitor function portion configured by including the first inner electrode layers and the second inner electrode layers.

7. The wiring board according to claim 1, wherein the inductor is formed on the capacitor, and a circuit portion is configured by the inductor and at least one of the resistor and the second capacitor.

8. The wiring board according to claim 7, wherein the circuit portion is a tuning circuit formed by connecting the resistor, the inductor, and the capacitor.

9. The wiring board according to claim 7, wherein the circuit portion is a filter circuit formed by connecting the resistor and the inductor.

10. A capacitor having a capacitor main surface and a capacitor reverse surface and having a structure in which first inner electrode layers and second inner electrode layers are alternately laminated and arranged via a dielectric layer, wherein a first terminal is formed on the capacitor main surface and a second terminal is formed on the capacitor reverse surface, wherein each of an inductor and a resistor are formed on the capacitor main surface or in the capacitor, and a second capacitor is formed in the capacitor, wherein the resistor is electrically connected to the first terminal through a first interlayer-connecting via conductor, and wherein the second capacitor is electrically connected to the first terminal through the first interlayer-connecting via conductor or to the second terminal by a second interlayer-connecting via conductor.

11. The capacitor according to claim 10, comprising:

a plurality of power supplying via conductors for allowing the first inner electrode layers to conduct with each other;

a plurality of grounding via conductors for allowing the second inner electrode layers to conduct with each other;

power supplying electrode terminals respectively located at end portions of the plurality of power supplying via conductors; and grounding electrode terminals respectively located at end portions of the plurality of grounding via conductors, wherein the plurality of power supplying via conductors and the plurality of grounding via conductors are disposed in the form of arrays.

12. The capacitor according to claim 11, wherein the inductor is an obverse surface-side inductor pattern which is formed on the capacitor main surface from a same material as that of the power supplying electrode terminals and the grounding electrode terminals.

13. The capacitor according to claim 12, wherein the obverse surface-side inductor pattern is a loop-shaped pattern.

14. The capacitor according to claim 10, wherein the inductor is disposed in a region located outside a capacitor function portion configured by including the first inner electrode layers and the second inner electrode layers.

15. The capacitor according to claim 10, wherein the inductor is formed on the capacitor, and a circuit portion is configured by the inductor and at least one of the resistor and the capacitor.

16. The capacitor according to claim 15, wherein the circuit portion is a tuning circuit formed by connecting the resistor, the inductor, and the capacitor.

17. The capacitor according to claim 15, wherein the circuit portion is a filter circuit formed by connecting the resistor and the inductor.

* * * * *